US012378354B2

United States Patent
Soh et al.

(10) Patent No.: US 12,378,354 B2
(45) Date of Patent: Aug. 5, 2025

(54) ACTIVE ESTER RESIN, METHOD FOR PRODUCING THEREOF, EPOXY RESIN COMPOSITION, CURED PRODUCT THEREOF, PREPREG, LAMINATED BOARD, AND MATERIAL FOR CIRCUIT SUBSTRATE

(71) Applicants: NIPPON STEEL Chemical & Material Co., Ltd., Tokyo (JP);
KUKDO CHEMICAL CO., LTD., Seoul (KR)

(72) Inventors: Masahiro Soh, Tokyo (JP); Kazuo Ishihara, Tokyo (JP); Jin Soo Lee, Seoul (KR); Chan Ho Park, Seoul (KR); Joong Hwi Jee, Seoul (KR)

(73) Assignees: NIPPON STEEL Chemical & Material Co., Ltd., Tokyo (JP);
KUKDO CHEMICAL CO., LTD., Seoul (KR)

( * ) Notice: Subject to any disclaimer, the term of this patent is extended or adjusted under 35 U.S.C. 154(b) by 460 days.

(21) Appl. No.: 17/798,893

(22) PCT Filed: Feb. 4, 2021

(86) PCT No.: PCT/JP2021/004188
§ 371 (c)(1),
(2) Date: Aug. 11, 2022

(87) PCT Pub. No.: WO2021/166669
PCT Pub. Date: Aug. 26, 2021

(65) Prior Publication Data
US 2023/0097650 A1    Mar. 30, 2023

(30) Foreign Application Priority Data
Feb. 17, 2020    (JP) .................. 2020-024357

(51) Int. Cl.
*C08G 63/64*    (2006.01)
*C08G 59/42*    (2006.01)
(Continued)

(52) U.S. Cl.
CPC ......... *C08G 63/64* (2013.01); *C08G 59/4276* (2013.01); *C08G 63/183* (2013.01);
(Continued)

(58) Field of Classification Search
CPC .. C08G 63/64; C08G 59/4276; C08G 63/183; C08G 63/19; C08G 63/199;
(Continued)

(56) References Cited

U.S. PATENT DOCUMENTS

2017/0174957 A1* 6/2017 Kuo ................. C07C 43/295
2019/0367647 A1* 12/2019 Li .................. C09D 133/14

FOREIGN PATENT DOCUMENTS

| JP | H05339341 | 12/1993 |
|----|-----------|---------|
| JP | H07157546 | 6/1995 |
| JP | H07278263 | 10/1995 |
| JP | 2004159021 | 6/2004 |
| JP | 2004277461 | 10/2004 |
| JP | 2009235165 | 10/2009 |
| JP | 2009242560 | 10/2009 |
| JP | 2018184578 | 11/2018 |
| WO | 2018008409 | 1/2018 |
| WO | 2018008411 | 1/2018 |

OTHER PUBLICATIONS

Machine Translation of JP 2004-277461 Description Section (Year: 2004).*

(Continued)

*Primary Examiner* — John M Cooney
*Assistant Examiner* — Adam J Berro
(74) *Attorney, Agent, or Firm* — JCIPRNET

(57) ABSTRACT

To provide an epoxy resin composition that exhibits excellent low-dielectric properties and that is excellent in copper foil peel strength and interlayer cohesion strength in a printed-wiring board application, as well as an active ester resin that provides the epoxy resin composition. An active ester resin having a polyaryloxy unit containing a dicyclopentenyl group and represented by the following formula (1), and a polyarylcarbonyl unit. Here, $R^1$ represents a hydrocarbon group having 1 to 8 carbon atoms, $R^2$ represents a hydrogen atom, or formula (1a) or formula (1b), and at least one $R^2$ is formula (1a) or formula (1b); and n represents a number of repetitions of 1 to 5.

11 Claims, 3 Drawing Sheets

(51) Int. Cl.
  *C08G 63/183* (2006.01)
  *C08G 63/19* (2006.01)
  *C08G 63/199* (2006.01)
  *C08G 63/682* (2006.01)
  *C08J 5/18* (2006.01)
  *C08J 5/24* (2006.01)
  *C08L 63/04* (2006.01)
  *H05K 1/03* (2006.01)

(52) U.S. Cl.
  CPC ........... *C08G 63/19* (2013.01); *C08G 63/199* (2013.01); *C08G 63/682* (2013.01); *C08J 5/18* (2013.01); *C08J 5/24* (2013.01); *C08L 63/04* (2013.01); *H05K 1/0313* (2013.01); *C08L 2203/206* (2013.01)

(58) Field of Classification Search
  CPC .. C08G 63/682; C08J 5/18; C08J 5/24; C08L 63/04; C08L 2203/206; H05K 1/0313
  See application file for complete search history.

(56) References Cited

OTHER PUBLICATIONS

Key Engineering Materials, y. 2021, v. 871, p. 222-227 (Year: 2021).*
ACS Omega y.2018 v.3 p. 4295 (Year: 2018).*
"International Search Report (Form PCT/ISA/210) of PCT/JP2021/004188," mailed on Apr. 20, 2021, with English translation thereof, pp. 1-4.

* cited by examiner

ACTIVE ESTER RESIN, METHOD FOR PRODUCING THEREOF, EPOXY RESIN COMPOSITION, CURED PRODUCT THEREOF, PREPREG, LAMINATED BOARD, AND MATERIAL FOR CIRCUIT SUBSTRATE

CROSS-REFERENCE TO RELATED APPLICATION

This application is a 371 application of the International PCT application serial no. PCT/JP2021/004188, filed on Feb. 4, 2021, which claims the priority benefits of Japan Patent Application No. 2020-024357, filed on Feb. 17, 2020. The entirety of each of the above-mentioned patent applications is hereby incorporated by reference herein and made a part of this specification.

TECHNICAL FIELD

The present invention relates to an active ester resin excellent in dielectric properties and adhesiveness, and an epoxy resin composition, an epoxy resin-cured product, a prepreg, a laminated board, a printed-wiring substrate and a build-up film each using the active ester resin.

BACKGROUND ART

Epoxy resins are excellent in adhesiveness, flexibility, heat resistance, chemical resistance, insulation properties and curing reactivity, and thus are used variously in paints, civil adhesion, cast molding, electrical and electronic materials, film materials, and the like. In particular, epoxy resins, to which flame retardance is imparted, are widely used in applications of printed-wiring substrates as one of electrical and electronic materials.

In recent years, information equipment has been rapidly progressively reduced in size and increased in performance, and materials for use in the fields of semiconductors and electronic components have been accordingly demanded to have higher performance than even before. In particular, epoxy resin compositions serving as materials for electrical and electronic components have been demanded to have low-dielectric properties along with thinning and functionalization of substrates.

For the purpose of achievement of low-dielectric properties of such epoxy resin compositions, Patent Literature 1 described below has reported that a cured product excellent in low-dielectric properties is obtained by curing an epoxy resin with an active ester compound obtained by a reaction of a phenol compound with an aromatic dicarboxylic acid halide.

Patent Literature 2 has reported an active ester resin that is enhanced in heat resistance, low-dielectric properties and furthermore solvent solubility by a reaction of a dicyclopentadiene-type aromatic polyvalent hydroxy compound and a monohydroxy compound, as phenol compounds, with an aromatic dicarboxylic acid halide.

Both the active ester resins disclosed in the Literatures listed above have not sufficiently satisfied requirements based on recent increases in functions, and have been insufficient for retaining low-dielectric properties and adhesiveness.

On the other hand, Patent Literature 3 has disclosed a 2,6-xylenol/dicyclopentadiene-type epoxy resin, but has not disclosed any resin where substitution with a plurality of dicyclopentadienes is made on a phenol ring, and also has not made studies about any active ester resin.

CITATION LIST

Patent Literatures

Patent Literature 1: Japanese Patent Laid-Open No. 2004-277461
Patent Literature 2: Japanese Patent Laid-Open No. 2009-235165
Patent Literature 3: Japanese Patent Laid-Open No. 5-339341

SUMMARY OF INVENTION

Accordingly, a problem to be solved by the present invention is to provide a curable resin composition that allows a cured product to exhibit excellent dielectric properties and furthermore that is excellent in copper foil peel strength and interlayer cohesion strength in a printed-wiring board application.

In order to solve the above problem, the present inventors have found that, in a case where an aromatic polyvalent hydroxy compound obtained by a reaction of a 2,6-disubstituted phenol compound with dicyclopentadiene at a specified ratio is converted into an active ester and cured with an epoxy resin, a cured product obtained is excellent in low-dielectric properties and adhesiveness, thereby completing the present invention.

In other words, the present invention relates to an active ester resin having a polyaryloxy unit containing a dicyclopentenyl group and represented by the following formula (1), and a polyarylcarbonyl unit:

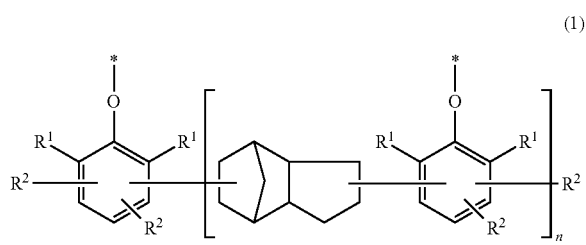

wherein each $R^1$ independently represents a hydrocarbon group having 1 to 8 carbon atoms, each $R^2$ independently represents a hydrogen atom, or a dicyclopentenyl group represented by the following formula (1a) or formula (1b), and at least one $R^2$ is the dicyclopentenyl group; n represents the number of repetitions and an average value thereof is a number of 1 to 5; and "*" is a linking site bonded to a carbonyl group of the polyarylcarbonyl unit.

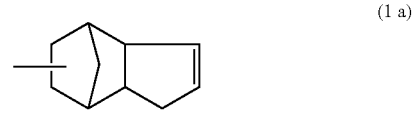

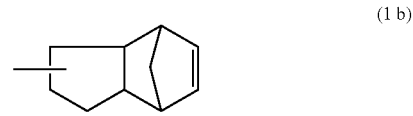

Preferably, the active ester resin includes an additional polyaryloxy unit other than the unit represented by the formula (1) as a polyaryloxy unit, and the additional polyaryloxy unit is a unit represented by the following formula (2) and/or formula (3):

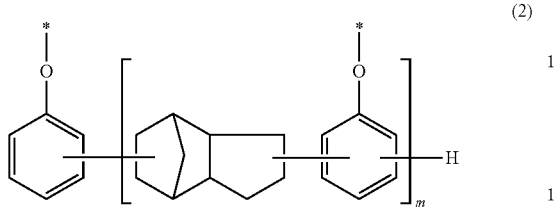

(2)

wherein m represents the number of repetitions and an average value thereof is a number of 1 to 5; and "*" is a linking site bonded to the carbonyl group of the polyarylcarbonyl unit;

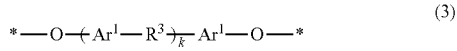

(3)

wherein each $Ar^1$ independently represents any aromatic ring group of a benzene ring or a naphthalene ring, and an aromatic ring thereof optionally has an alkyl group having 1 to 10 carbon atoms, an alkoxy group having 1 to 10 carbon atoms, an aryl group having 6 to 11 carbon atoms, an aralkyl group having 7 to 12 carbon atoms, an aryloxy group having 6 to 11 carbon atoms, or an aralkyloxy group having 7 to 12 carbon atoms, as a substituent; $R^3$ is a direct bond, or a divalent group selected from the group consisting of a hydrocarbon group having 1 to 20 carbon atoms, —CO—, —O—, —S—, —$SO_2$— and —$C(CF_3)_2$—; k is 0 or 1; and "*" is a linking site bonded to the carbonyl group of the polyarylcarbonyl unit.

Preferably, the active ester resin has a monoaryloxy group at a molecular chain end, and the monoaryloxy group is a group represented by the following formula (4) and/or formula (5):

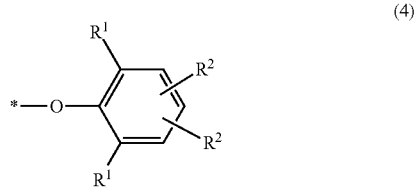

(4)

wherein $R^1$ and $R^2$ have the same meanings as in the formula (1); and "*" is a linking site bonded to the carbonyl group of the polyarylcarbonyl unit;

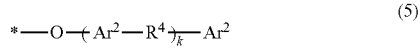

(5)

wherein each $Ar^2$ independently represents any aromatic ring group of a benzene ring or a naphthalene ring, and an aromatic ring thereof optionally has an alkyl group having 1 to 10 carbon atoms, an alkoxy group having 1 to 10 carbon atoms, an aryl group having 6 to 11 carbon atoms, an aralkyl group having 7 to 12 carbon atoms, an aryloxy group having 6 to 11 carbon atoms, or an aralkyloxy group having 7 to 12 carbon atoms, as a substituent; $R^4$ is a direct bond, or a divalent group selected from the group consisting of —$CH_2$—, —$C(CH_3)_2$—, —$CH(CH_3)$—, —CO—, —O—, —S—, —$SO_2$— and —$C(CF_3)_2$—; k is 0 or 1; and "*" is a linking site bonded to the carbonyl group of the polyarylcarbonyl unit.

Preferably, the polyarylcarbonyl unit is a unit represented by the following formula (6):

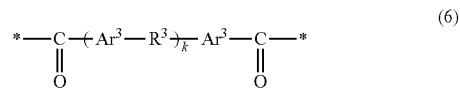

(6)

wherein each $Ar^3$ independently represents any aromatic ring group of a benzene ring or a naphthalene ring, and an aromatic ring thereof optionally has an alkyl group having 1 to 10 carbon atoms, an alkoxy group having 1 to 10 carbon atoms, an aryl group having 6 to 11 carbon atoms, an aralkyl group having 7 to 12 carbon atoms, an aryloxy group having 6 to 11 carbon atoms, or an aralkyloxy group having 7 to 12 carbon atoms, as a substituent; $R^3$ is a direct bond, or a divalent group selected from the group consisting of a hydrocarbon group having 1 to 20 carbon atoms, —CO—, —O—, —S—, —$SO_2$— and —$C(CF_3)_2$—; k is 0 or 1; and "*" is a linking site bonded to the linking site of the polyaryloxy unit.

The present invention also relates to a method for producing an active ester resin from an aromatic hydroxy compound and an aromatic polyvalent carboxylic acid or an acid halide thereof, wherein the aromatic hydroxy compound is an aromatic hydroxy compound containing a dicyclopentenyl group and represented by the following formula (7):

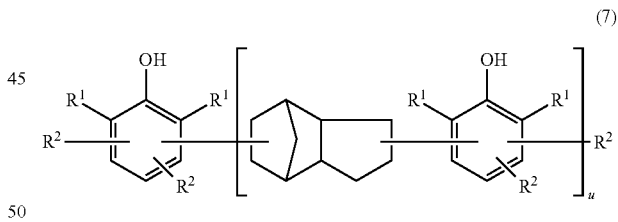

(7)

wherein each $R^1$ independently represents a hydrocarbon group having 1 to 8 carbon atoms, each $R^2$ independently represents a hydrogen atom, or a dicyclopentenyl group represented by the following formula (1a) or formula (1b), and at least one $R^2$ is the dicyclopentenyl group; and u represents the number of repetitions and contains a u=0 component and a u≥1 component, and an average value of the u≥1 component is a number of 1 to 5.

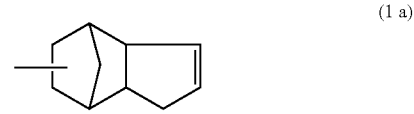

(1a)

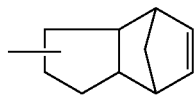 (1b)

The present invention relates to a method for producing the active ester resin, including: reacting a 2,6-disubstituted phenol compound and dicyclopentadiene to obtain the aromatic hydroxy compound containing the dicyclopentenyl group represented by the formula (7); and reacting the aromatic hydroxy compound and an aromatic polyvalent carboxylic acid or an acid halide thereof.

In the method for producing an active ester resin, the aromatic hydroxy compound is preferably obtained by reacting 0.28 to 2 mol of dicyclopentadiene per mol of a 2,6-disubstituted phenol compound.

The present invention relates to an epoxy resin composition including the active ester resin and an epoxy resin as essential components.

The present invention relates to a cured product obtained by curing the epoxy resin composition, and a prepreg, a laminated board and a material for a circuit substrate, each using the epoxy resin composition.

The epoxy resin composition of the present invention allows a cured product thereof to exhibit excellent dielectric properties, and furthermore is excellent in copper foil peel strength and interlayer cohesion strength in a printed-wiring board application. In particular, the epoxy resin composition can be suitably used in, for example, a mobile application or and server application, in which a low dielectric tangent is strongly required.

DESCRIPTION OF EMBODIMENTS

Figure 1:
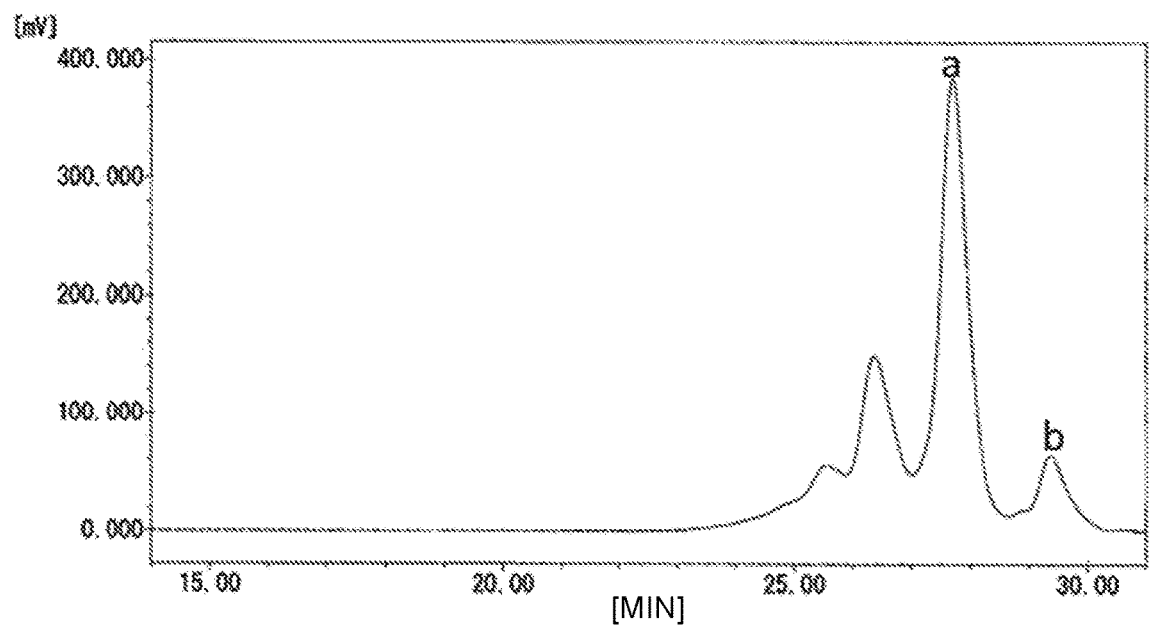
FIG. 1 A GPC chart of an aromatic hydroxy compound obtained in Synthesis Example 1.

Hereinafter, embodiments of the present invention will be described in detail.

The active ester resin of the present invention includes a polyaryloxy unit essentially having the group represented by the formula (1), and a polyarylcarbonyl unit. The polyaryloxy unit is a residue of an aromatic polyvalent hydroxy compound as a raw material, and the polyarylcarbonyl unit is a residue of an aromatic polyvalent carboxylic acid (aromatic polyvalent carboxylic acid halide) as a raw material. A molecular chain end preferably has a monoaryloxy group. The monoaryloxy group is a group derived from an aromatic monohydroxy compound as a raw material.

Herein, the aromatic polyvalent hydroxy compound and the aromatic monohydroxy compound may be collectively called and simply abbreviated as "aromatic hydroxy compound". The aromatic polyvalent carboxylic acid or acid halide thereof and the aromatic monocarboxylic acid or acid halide thereof may also be collectively called and simply abbreviated as "aromatic carboxylic acid or acid halide thereof".

The active ester resin of the present invention, in which an ester bond has high reaction activity with an epoxy group, thus can be suitably used as a curing agent of an epoxy resin. A cured product obtained then exhibits a low dielectric tangent and a low relative permittivity due to synergistic action of the effect of no generation of any high-polarity hydroxy group during curing and the effect by having a dicyclopentadiene-derived substituent $R^2$. Furthermore, the molecular chain end is an aryloxycarbonyl group, thus a free low-molecular weight carboxylic acid which causes an increase in dielectric tangent is not generated even if an ester bond as a crosslinking point in a cured product obtained is hydrolyzed by moisture absorption, and such a cured product obtained exhibits a low dielectric tangent even under a high humidity condition. A molecular chain has therein a large number of ester bonds having reaction activity with an epoxy group, and thus such a cured product is increased in crosslinking density and increased in heat resistance (glass transition temperature: Tg). Furthermore, the structure thereof has many hydrophobic dicyclopentadiene-derived alicyclic structures, thus less water absorption is caused, and stable dielectric properties are exhibited even under a high-humidity environment.

In the formula (1), $R^1$ preferably represents a hydrocarbon group having 1 to 8 carbon atoms, an alkyl group having 1 to 8 carbon atoms, an aryl group having 6 to 8 carbon atoms, an aralkyl group having 7 to 8 carbon atoms, or an allyl group. The alkyl group having 1 to 8 carbon atoms may be any of linear, branched and cyclic groups, and examples thereof include a methyl group, an ethyl group, a propyl group, an isopropyl group, a n-butyl group, a t-butyl group, a hexyl group, a cyclohexyl group and a methylcyclohexyl group, but not limited thereto. Examples of the aryl group having 6 to 8 carbon atoms include a phenyl group, a tolyl group, a xylyl group and an ethylphenyl group, but not limited thereto. Examples of the aralkyl group having 7 to 8 carbon atoms include a benzyl group and an α-methylbenzyl group, but not limited thereto. Among these substituents, a phenyl group and a methyl group are preferable and a methyl group is particularly preferable, from the viewpoints of availability, and reactivity of a cured product obtained.

Each $R^2$ independently represents a hydrogen atom, or the formula (1a) or formula (1b), and at least one $R^2$ is any of the formula (1a) or formula (1b). The formula (1a) and formula (1b) can be said to be each a dicyclopentadiene-derived dicyclopentenyl group.

n is the number of repetitions and represents a number of 1 or more, and the average value (number average) thereof is 1 to 5, preferably 1.1 to 4.0, more preferably 1.2 to 3.0, further preferably 1.3 to 2.0.

As the polyaryloxy unit, a unit other than the dicyclopentadienyl-containing unit represented by the formula (1) is optionally included as long as the objects of the present invention are not impaired, and such unit preferably corresponds to the dicyclopentadienyl-containing unit represented by the formula (2) and/or the unit represented by the formula (3).

Herein, the dicyclopentadienyl-containing unit represented by the formula (1) is desirably contained in an amount of preferably 20% by mol or more, more preferably 30% by mol or more, further preferably 50% by mol or more based on the entire amount of the polyaryloxy unit constituting the active ester resin of the present invention. The dicyclopentadienyl-containing unit represented by the formula (1) and the dicyclopentadienyl-containing unit represented by the formula (2) are desirably contained in a total amount of preferably 30% by mol or more, more preferably 50% by mol or more based on the entire amount of the polyaryloxy unit.

In the formula (2), m represents the number of repetitions and the average value thereof is a number of 1 to 5.

The formula (3) is obtained by generalizing units represented by the following formula (3a) to formula (3e). The formula (5) and the formula (6) are also obtained by generalizing their corresponding units.

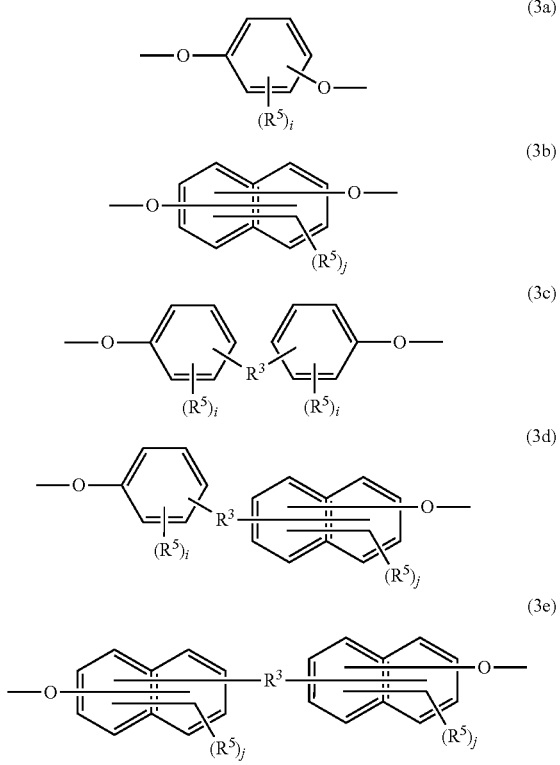

Here, $R^3$ has the same meaning as $R^3$ in the formula (3); $R^5$ is an alkyl group having 1 to 10 carbon atoms, an alkoxy group having 1 to 10 carbon atoms, an aryl group having 6 to 11 carbon atoms, an aralkyl group having 7 to 12 carbon atoms, an aryloxy group having 6 to 11 carbon atoms, or an aralkyloxy group having 7 to 12 carbon atoms; and i is an integer of 0 to 4 and j is an integer of 0 to 6.

In the formula (3), $Ar^1$ represents any aromatic ring group of a benzene ring or a naphthalene ring. An aromatic ring thereof may include only a benzene ring or a naphthalene ring, or may have a substituent $R^5$. The substituent $R^5$ is here an alkyl group having 1 to 10 carbon atoms, an alkoxy group having 1 to 10 carbon atoms, an aryl group having 6 to 11 carbon atoms, an aralkyl group having 7 to 12 carbon atoms, an aryloxy group having 6 to 11 carbon atoms, or an aralkyloxy group having 7 to 12 carbon atoms.

The alkyl group having 1 to 10 carbon atoms may be any of linear, branched and cyclic groups, and examples thereof include a methyl group, an ethyl group, a n-propyl group, a n-butyl group, a n-pentyl group, a n-hexyl group, a n-heptyl group, a n-octyl group, a n-nonyl group, a n-decyl group, an isopropyl group, a sec-butyl group, a t-butyl group, an isopentyl group, a neopentyl group, a t-pentyl group, an isohexyl group, a cyclopentyl group, a cyclohexyl group, a cycloheptyl group, a methylcyclohexyl group, a cyclooctyl group, a dimethylcyclohexyl group, an ethylcyclohexyl group, a trimethylcyclohexyl group and a cyclodecyl group.

The alkoxy group having 1 to 10 carbon atoms may be any of linear, branched and cyclic groups, and examples thereof include a methoxy group, an ethoxy group, a n-propoxy group, a n-butoxy group, a n-pentyloxy group, a n-hexyloxy group, a n-heptyloxy group, a n-octyloxy group, a n-nonyloxy group, a n-decyloxy group, an isopropoxy group, a sec-butoxy group, a t-butoxy group, an isopentyloxy group, a neopentyloxy group, a t-pentyloxy group, an isohexyloxy group, a cyclopentyloxy group, a cyclohexyloxy group, a cycloheptyloxy group, a methylcyclohexyloxy group, a cyclooctyloxy group, a dimethylcyclohexyloxy group, an ethylcyclohexyloxy group, a trimethylcyclohexyloxy group and a cyclodecyloxy group.

Examples of the aryl group or aryloxy group having 6 to 11 carbon atoms include a phenyl group, a tolyl group, an ethylphenyl group, a xylyl group, a propylphenyl group, a mesityl group, a naphthyl group, a methylnaphthyl group, a phenoxy group, a tolyloxy group, an ethylphenoxy group, a xylyloxy group, a propylphenoxy group, a mesityloxy group, a naphthyloxy group and a methylnaphthyloxy group.

Examples of the aralkyl group or aralkyloxy group having 7 to 12 carbon atoms include a benzyl group, a methylbenzyl group, a dimethylbenzyl group, a trimethylbenzyl group, a phenethyl group, a 1-phenylethyl group, a 2-phenylisopropyl group, a naphthylmethyl group, a benzyloxy group, a methylbenzyloxy group, a dimethylbenzyloxy group, a trimethylbenzyloxy group, a phenethyloxy group, a 1-phenylethyloxy group, a 2-phenylisopropyloxy group and a naphthylmethyloxy group.

$Ar^1$ is preferably a phenylene group, a naphthylene group, or an aromatic ring group in which such a phenylene group or naphthylene group has a substituent such as a methyl group or a 1-phenylethyl group.

In the formula (3), $R^3$ is a direct bond, or a divalent group selected from a hydrocarbon group having 1 to 20 carbon atoms, —CO—, —O—, —S—, —SO$_2$— and —C(CF$_3$)$_2$—.

Examples of the hydrocarbon group having 1 to 20 carbon atoms include —CH$_2$—, —CH(CH$_3$)—, —C$_2$H$_4$—, —C(CH$_3$)$_2$—, a cyclohexylene group, a methylcyclohexylene group, a dimethylcyclohexylene group, a methylisopropylcyclohexylene group, a cyclohexylcyclohexylene group, a cyclohexylidene group, a methylcyclohexylidene group, a dimethylcyclohexylidene group, a trimethylcyclohexylidene group, a tetramethylcyclohexylidene group, an ethylcyclohexylidene group, an isopropylcyclohexylidene group, a t-butylcyclohexylidene group, a phenylcyclohexylidene group, a cyclohexylcyclohexylidene group, a (methylcyclohexyl)cyclohexylidene group, an (ethylcyclohexyl)cyclohexylidene group, a (phenylcyclohexyl)cyclohexylidene group, a cyclododecylene group, a cyclopentylidene group, a methylcyclopentylidene group, a trimethylcyclopentylidene group, a cyclooctylidene group, a cyclododecylidyne group, a 9H-fluorene-9,9-diyl group, a bicyclo[4.4.0]decylidene group, a bicyclohexanediyl group, a phenylene group, a xylylene group, a phenylmethylene group, a diphenylmethylene group, a norbornylene group, an adamantylene group, a tetrahydrodicyclopentadienylene group, a tetrahydrotricyclopentadienylene group, and a divalent group having a norbornane structure, a tetrahydrotricyclopentadiene structure or the like.

$R^3$ is preferably a direct bond, —$CH_2$—, —$CH(CH_3)$—, —$C(CH_3)_2$—, —CO—, —O—, —S—, —$SO_2$—, a trimethylcyclohexylidene group, a cyclooctylidene group, a cyclododecylidene group, a bicyclohexanediyl group, a 9H-fluorene-9,9-diyl group or a phenylmethylene group.

The active ester resin of the present invention has a monoaryloxy group at a molecular chain end, and the monoaryloxy group is not particularly limited and preferably corresponds to the group represented by the formula (4) and/or formula (5), more preferably the group represented by the formula (4).

The dicyclopentadienyl-containing group represented by the formula (4) is desirably contained in an amount of preferably 20% by mol or more, more preferably 50% by mol or more based on the entire amount of the monoaryloxy group constituting the molecular chain end.

In the formula (4), $R^1$ and $R^2$ respectively have the same meanings as $R^1$ and $R^2$ in the formula (1), and the same applies to respective preferable substituents.

In the formula (5), $Ar^2$ is the same aromatic ring group as and optionally has the same substituent as in $Ar^1$ in the formula (3), and the same applies to preferable substituents.

$R^4$ is a direct bond, or a divalent group selected from —$CH_2$—, —$C(CH_3)_2$—, —$CH(CH_3)$—, —CO—, —O—, —S—, —$SO_2$— and —$C(CF_3)_2$—.

The polyarylcarbonyl unit is not particularly limited, and is preferably the unit represented by the formula (6).

In the formula (6), $Ar^3$ is the same aromatic ring group as and optionally has the same substituent as in $Ar^1$ in the formula (3), and the same applies to preferable substituents. $R^3$ has the same meaning as $R^3$ in the formula (3).

The aromatic hydroxy compound as an essential raw material for synthesis of the active ester resin is represented by the formula (7), and can be obtained by a reaction of a 2,6-disubstituted phenol compound with dicyclopentadiene in the presence of a Lewis acid such as a boron trifluoride/ether catalyst.

In the aromatic hydroxy compound, a u=0 component corresponds to the monoaryloxy group represented by the formula (4), serving as the molecular chain end of the active ester resin, and a u=1 or more component corresponds to the polyaryloxy unit the formula (1), of the active ester resin.

The content of the u=0 component may be 0 to 90% by area, and is preferably 5 to 80% by area, more preferably 10 to 50% by area. The content of the u=1 component may be 7 to 90% by area, and is preferably 15 to 70% by area, more preferably 30 to 60% by area. The total content of a u=2 or more component may be 3 to 50% by area, and is preferably 5 to 35% by area, more preferably 10 to 25% by area.

The aromatic hydroxy compound, if included in a large amount in the form of one where the average value of u exceeds 1.8, may be dissolved in a solvent to result in gelation during synthesis of the active ester resin. Therefore, one where the average value of u is in the range from 0.3 to 1.8 is preferably used, and a more preferable range is from 0.5 to 1.7 and a further preferable range is from 0.8 to 1.6. The gelation can be prevented by appropriately adjusting the amount of use depending on the average value of u and using an additional monovalent or divalent aromatic hydroxy compound in combination.

Examples of the 2,6-disubstituted phenol compound include 2,6-dimethylphenol, 2,6-diethylphenol, 2,6-dipropylphenol, 2,6-diisopropylphenol, 2,6-di(n-butyl)phenol, 2,6-di(t-butyl)phenol, 2,6-dihexylphenol, 2,6-dicyclohexylphenol, 2,6-diphenylphenol, 2,6-ditolylphenol, 2,6-dibenzylphenol, 2,6-bis(α-methylbenzyl)phenol, 2-ethyl-6-methylphenol, 2-allyl-6-methylphenol and 2-tolyl-6-phenylphenol, and 2,6-diphenylphenol and 2,6-dimethylphenol are preferable and 2,6-dimethylphenol is particularly preferable from the viewpoints of availability, and reactivity of a cured product obtained.

The catalyst for use in the reaction is a Lewis acid, is specifically, for example, boron trifluoride, a boron trifluoride/phenol complex, a boron trifluoride/ether complex, aluminum chloride, tin chloride, zinc chloride or iron chloride, and in particular, a boron trifluoride/ether complex is preferable in terms of ease of handling. In the case of a boron trifluoride/ether complex, the amount of the catalyst used is 0.001 to 20 parts by mass, preferably 0.5 to 10 parts by mass based on 100 parts by mass of the dicyclopentadiene.

The reaction method for introducing the dicyclopentenyl group represented by the formula (1a) or formula (1b) into the 2,6-disubstituted phenol compound is a method for reacting dicyclopentadiene with 2,6-disubstituted phenol at a predetermined ratio, and the dicyclopentadiene may be reacted at two stages divided. The ratio of the dicyclopentadiene to the 2,6-disubstituted phenol is 0.1 to 0.25-fold moles in a common reaction, whereas the ratio is 0.28 to 2-fold moles, preferably 0.3 to 1.5-fold moles, more preferably 0.5 to 1.3-fold moles in the present invention.

The method of confirming introduction of the substituent represented by the formula (1a) or formula (1b) into the aromatic hydroxy compound represented by the general formula (7) can be made by using mass spectrometry or FT-IR measurement.

In the case of use of mass spectrometry, for example, electrospray mass spectrometry (ESI-MS) or a field desorption method (FD-MS) can be used. The introduction of the substituent represented by the formula (1a) or formula (1b) can be confirmed by subjecting a sample where components different in number of nuclei are separated in GPC or the like, to mass spectrometry.

In the case of use of a FT-IR measurement method, a KRS-5 cell is coated with a sample dissolved in an organic solvent such as THF and such a cell provided with a thin film of the sample, obtained by drying the organic solvent, is subjected to FT-IR measurement, and thus a peak assigned to C—O stretching vibration of a phenol nucleus appears around 1210 $cm^{-1}$ and a peak assigned to C—H stretching vibration of an olefin moiety of a dicyclopentadiene backbone appears around 3040 $cm^{-1}$ only in the case of introduction of the formula (1a) or formula (1b). When one obtained by linearly connecting the start and the end of an objective peak is defined as a baseline and the length from the top of the peak to the baseline is defined as a peak height, the amount of introduction of the formula (1a) or formula (1b) can be quantitatively determined by the ratio ($A_{3040}/A_{1210}$) of the peak ($A_{3040}$) around 3040 $cm^{-1}$ to the peak ($A_{1210}$) around 1210 $cm^{-1}$.

It can be confirmed that, as the ratio is higher, the values of physical properties are more favorable, and a preferable ratio ($A_{3040}/A_{1210}$) for satisfaction of objective physical properties is 0.05 or more, more preferably 0.10 or more. The upper limit is preferably 0.7 or less, more preferably 0.60 or less. As the ratio is higher, the dicyclopentadiene substituent is more introduced.

The present reaction is favorably made in a manner where the 2,6-disubstituted phenol compound and the catalyst are loaded into a reactor and the dicyclopentadiene is dropped over 1 to 10 hours.

The reaction temperature is preferably 50 to 200° C., more preferably 100 to 180° C., further preferably 120 to 160° C. The reaction time is preferably 1 to 10 hours, more preferably 3 to 10 hours, further preferably 4 to 8 hours.

After completion of the reaction, the catalyst is deactivated by addition of an alkali such as sodium hydroxide, potassium hydroxide, or calcium hydroxide. Thereafter, a solvent, for example, an aromatic hydrocarbon compound such as toluene or xylene or a ketone compound such as methyl ethyl ketone or methyl isobutyl ketone is added for dissolution, the resultant is washed with water, thereafter the solvent is recovered under reduced pressure, and thus an objective aromatic hydroxy compound can be obtained. Preferably, the dicyclopentadiene is reacted in the entire amount as much as possible and some, preferably, 10% or less of the 2,6-disubstituted phenol compound is unreacted and recovered under reduced pressure.

During the reaction, a solvent, for example, an aromatic hydrocarbon compound such as benzene, toluene or xylene, a halogenated hydrocarbon compound such as chlorobenzene or dichlorobenzene, or an ether compound such as ethylene glycol dimethyl ether or diethylene glycol dimethyl ether may be, if necessary, used.

When the active ester resin of the present invention is produced, an aromatic polyvalent hydroxy compound other than the aromatic hydroxy compound represented by the formula (7) may be used in combination as long as the objects of the present invention are not impaired.

Herein, the dicyclopentenyl group-containing aromatic hydroxy compound represented by the formula (7) is desirably contained in an amount of preferably 20% by mol or more, more preferably 30% by mol or more, further preferably 50% by mol or more, based on the entire amount of the aromatic hydroxy compound used as a raw material.

The aromatic polyvalent hydroxy compound which may be used in combination can be any one with no particular limitation, and an aromatic polyvalent hydroxy compound represented by the following formula (9) and/or formula (10) is preferable:

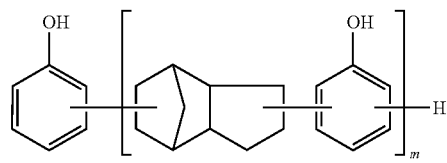
(9)

wherein m has the same meaning as m in the formula (2);

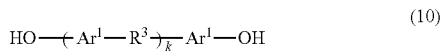
(10)

wherein $Ar^1$, $R^3$, and k respectively have the same meanings as $Ar^1$, $R^3$, and k in the formula (3).

The aromatic polyvalent hydroxy compound represented by the formula (9), if used in combination in a large amount in the form of one where the average value of m exceeds 1.2, may be dissolved in a solvent to result in gelation during synthesis of the active ester resin. Therefore, when the aromatic polyvalent hydroxy compound represented by the formula (9) is used in combination, one is preferably used where the average value of m is in the range from 1 to 1.2. The gelation can be prevented by appropriately adjusting the amount of use of the aromatic polyvalent hydroxy compound represented by the formula (9), depending on the value of m. For example, when m is 2, the amount of use is preferably 20% by mol or less based on the entire amount of the aromatic polyvalent hydroxy compound used.

Examples of the aromatic dihydroxy compound represented by the formula (10) include dihydroxybenzene compounds such as catechol, resorcin, methylresorcin, hydroquinone, monomethylhydroquinone, dimethylhydroquinone, trimethylhydroquinone, mono-t-butylhydroquinone and di-t-butylhydroquinone, naphthalene diol compounds such as naphthalene diol, methylnaphthalene diol and methylmethoxynaphthalene diol, biphenol compounds such as biphenol, dimethylbiphenol and tetramethylbiphenol, and bisphenol compounds such as bisphenol A, bisphenol F, bisphenol C, bisphenol K, bisphenol Z, bisphenol S, tetramethyl bisphenol A, tetramethyl bisphenol F, tetramethyl bisphenol S, tetramethyl bisphenol Z, dihydroxydiphenylsulfide, 4,4'-thiobis(3-methyl-6-t-butylphenol), bisphenol fluorene, biscresol fluorene and 9,9-bis(3,5-dimethyl-4-hydroxyphenyl)-9H-fluorene.

The aromatic monohydroxy compound may be used in combination. The aromatic monohydroxy compound which may be used in combination can be any one with no particular limitation, and an aromatic monohydroxy compound represented by the following formula (11) is preferable:

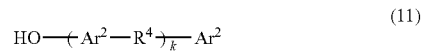
(11)

wherein $Ar^2$, $R^4$, and k respectively have the same meanings as $Ar^2$, $R^4$, and k in the formula (5).

Examples of the aromatic monohydroxy compound represented by the formula (11) include phenol, o-cresol, m-cresol, p-cresol, 3, 5-xylenol, o-phenylphenol, p-phenylphenol, 2-benzylphenol, 4-benzylphenol, 4-(α-cumyl) phenol, octylphenol, α-naphthol and β-naphthol. A cured product with the active ester resin, in which in particular α-naphthol, β-naphthol, o-phenylphenol, p-phenylphenol or 4-(α-cumyl)phenol is used in combination, as a curing agent, has a particularly low dielectric tangent.

The active ester resin of the present invention is obtained by a reaction of the aromatic polyvalent hydroxy compound and the aromatic polyvalent carboxylic acid or acid halide thereof. The aromatic hydroxy compound represented by the formula (7) is an essential component. The aromatic monocarboxylic acid or acid halide thereof may be used in combination in the reaction. The halogen of the aromatic carboxylic acid halide used is generally chlorine or bromine. Examples of the aromatic polyvalent carboxylic acid halide include a halide of an aromatic dicarboxylic acid represented by the following formula (12), and a halide of an aromatic tricarboxylic acid such as trimesic acid or trimellitic acid:

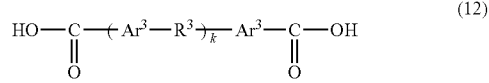
(12)

wherein $Ar^3$, $R^3$, and k respectively have the same meanings as $Ar^3$, $R^3$, and k in the formula (6).

Examples of the aromatic dicarboxylic acid represented by the formula (12) include phthalic acid, isophthalic acid, terephthalic acid, 1,4-naphthalenedicarboxylic acid, 2,3-naphthalenedicarboxylic acid, 2,6-naphthalenedicarboxylic acid, 1,6-naphthalenedicarboxylic acid, 2,7-naphthalenedicarboxylic acid, 4,4-biphenyl dicarboxylic acid, 4,4'-methylenebisbenzoic acid, 4,4'-carbonylbisbenzoic acid and 4,4'-isopropylidene dibenzoic acid. In particular, isophthalic acid chloride and terephthalic acid chloride are preferable from the viewpoint of the balance between solvent solubility and heat resistance.

Examples of the aromatic monocarboxylic acid halide include a halide of an aromatic monocarboxylic acid represented by the following formula (13). When such a halide of the aromatic monocarboxylic acid is used in combination, a molecular chain end partially corresponds to an arylcarbonyloxy group.

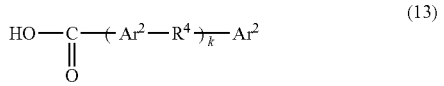
(13)

Here, $Ar^2$, $R^4$, and k respectively have the same meanings as $Ar^2$, $R^4$, and k in the formula (5).

Examples of the aromatic monocarboxylic acid represented by the formula (13) include benzoic acid, 1-naphthalenecarboxylic acid, 2-naphthalenecarboxylic acid and biphenylcarboxylic acid.

The method for reacting the aromatic hydroxy compound of the formula (7) and the aromatic carboxylic acid or acid halide thereof is specifically a method involving a reaction of these components in the presence of an alkali catalyst.

Examples of the alkali catalyst which can be here used include inorganic bases such as sodium hydroxide, potassium hydroxide, potassium carbonate and sodium carbonate, and organic bases such as triethylamine, diisopropylethylamine and pyridine, and in particular, sodium hydroxide and potassium hydroxide are preferable because of being in excellent in terms of reactivity and cost.

The reaction can be performed by mixing the aromatic hydroxy compound and the aromatic carboxylic acid or acid halide thereof in the presence of an organic solvent and adding the alkali catalyst. The amount of the alkali catalyst added is preferably 0.9 to 2.0 mol per mol of the phenolic hydroxyl group in the aromatic hydroxy compound.

Examples of the organic solvent used in the reaction include toluene, dichloromethane and chloroform, and toluene is preferable from the viewpoints of cost and environmental burden.

After completion of the reaction, the reaction liquid is neutralized and washed with water, and thus an objective resin can be obtained.

The active ester equivalent (g/eq.) of the active ester resin of the present invention is preferably 200 to 600, more preferably 220 to 500, further preferably 240 to 450. If the equivalent is less than the range, dielectric properties may be degraded, and if the equivalent is more than the range, heat resistance and adhesiveness may be deteriorated. The active ester group herein refers to the aryloxycarbonyl group in the active ester resin.

The active ester resin can be used as a curing agent to thereby obtain the epoxy resin composition of the present invention.

The epoxy resin composition of the present invention includes an epoxy resin and the active ester resin, as essential components. In this aspect, the active ester resin partially or fully corresponds to the active ester resin of the present invention, and the proportion of the active ester resin represented by the formula (1) in the entire active ester resin is preferably at least 30% by mass, more preferably 50% by mass or more, further preferably 75% by mass or more. If the proportion is less than such values, dielectric properties may be degraded.

The epoxy resin used for obtaining the epoxy resin in the present invention can be any usual epoxy resin having two or more epoxy groups in its molecule.

Examples include a bisphenol A-type epoxy resin, a bisphenol F-type epoxy resin, a tetramethyl bisphenol F-type epoxy resin, a hydroquinone-type epoxy resin, a biphenyl-type epoxy resin, a bisphenol fluorene-type epoxy resin, a bisphenol S-type epoxy resin, a bisthio ether-type epoxy resin, a resorcinol-type epoxy resin, a biphenylaralkylphenol-type epoxy resin, a naphthalene diol-type epoxy resin, a phenol novolac-type epoxy resin, a styrenated phenol novolac-type epoxy resin, a cresol novolac-type epoxy resin, an alkyl novolac-type epoxy resin, a bisphenol novolac-type epoxy resin, a naphthol novolac-type epoxy resin, a β-naphthol aralkyl-type epoxy resin, a dinaphthol aralkyl-type epoxy resin, an α-naphthol aralkyl-type epoxy resin, a trisphenylmethane-type epoxy resin, a dicyclopentadiene-type epoxy resin other than that in the present invention, an alkylene glycol-type epoxy resin, an aliphatic cyclic epoxy resin, diaminodiphenylmethane tetraglycidylamine, an aminophenol-type epoxy resin, a phosphorus-containing epoxy resin, a urethane-modified epoxy resin, and an oxazolidone ring-containing epoxy resin, but not limited thereto. These epoxy resins may be used singly or in combinations of two or more kinds thereof.

A naphthalene diol-type epoxy resin, a phenol novolac-type epoxy resin, an aromatic modified phenol novolac-type epoxy resin, a cresol novolac-type epoxy resin, an α-naphthol aralkyl-type epoxy resin, a dicyclopentadiene-type epoxy resin, a phosphorus-containing epoxy resin or an oxazolidone ring-containing epoxy resin is preferably used from the viewpoint of availability.

Various curing agents usually used, such as a phenol resin compound, an acid anhydride compound, an amine compound, a hydrazide compound and an acidic polyester compound, can be, if necessary, used, in addition to the active ester resin of the present invention, singly or in combinations of two or more kinds thereof. When such a curing agent is used in combination, the proportion of such a curing agent used in combination in the entire curing agent is preferably 70% by mass or less, more preferably 50% by mass or less, further preferably 25% by mass or less. If the proportion of such a curing agent used in combination is too high, the epoxy resin composition may have degraded dielectric properties and adhesion properties.

The number of moles of the active hydrogen group of the curing agent per mol of the epoxy group of the epoxy resin in the epoxy resin composition of the present invention is preferably 0.2 to 1.5 mol, more preferably 0.3 to 1.4 mol, further preferably 0.5 to 1.3 mol, particularly preferably 0.8 to 1.2 mol. If the number of moles does not fall within such a range, curing is incomplete and no favorable physical properties of a cured product may be obtained. For example, when a phenol resin-based curing agent or an amine-based curing agent is used in combination, the active hydrogen group and the epoxy group are compounded in almost equimolar amounts. When an acid anhydride-based curing agent is used in combination, the number of moles of the acid anhydride group compounded per mol of the epoxy group is 0.5 to 1.2 mol, preferably 0.6 to 1.0 mol. When the active ester resin of the present invention is singly used as a curing agent, the active ester resin is desirably used in the range from 0.9 to 1.1 mol per mol of the epoxy resin.

The active hydrogen group mentioned in the present invention means a functional group having active hydrogen reactive with an epoxy group (encompassing a functional group having potentially active hydrogen which generates active hydrogen by hydrolysis or the like, and a functional group exhibiting equivalent curing action), and specific examples include an acid anhydride group, a carboxyl group, an amino group and a phenolic hydroxyl group. Herein, 1 mol of a carboxyl group or a phenolic hydroxyl group is considered to correspond to 1 mol of the active hydrogen group and 1 mol of an amino group ($NH_2$) is considered to correspond to 2 mol of the active hydrogen group. When the active hydrogen group is not clear, the active hydrogen equivalent can be determined by measurement. For example, the active hydrogen equivalent of a curing agent used can be determined by a reaction of a monoepoxy resin having a known epoxy equivalent, such as phenyl glycidyl ether, and a curing agent having an unknown active hydrogen equivalent and then measurement of the amount of the monoepoxy resin consumed.

Specific examples of the phenol resin-based curing agent that can be used in combination in the epoxy resin composition of the present invention include phenol compounds mentioned as so-called novolac phenol resins, for example, bisphenol compounds such as bisphenol A, bisphenol F, bisphenol C, bisphenol K, bisphenol Z, bisphenol S, tetramethyl bisphenol A, tetramethyl bisphenol F, tetramethyl bisphenol S, tetramethyl bisphenol Z, dihydroxydiphenylsulfide and 4,4'-thiobis(3-methyl-6-t-butylphenol), dihydroxybenzene compounds such as catechol, resorcin, methylresorcin, hydroquinone, monomethylhydroquinone, dimethylhydroquinone, trimethylhydroquinone, mono-t-butylhydroquinone and di-t-butylhydroquinone, hydroxynaphthalene compounds such as dihydroxynaphthalene, dihydroxymethylnaphthalene, dihydroxymethylnaphthalene and trihydroxynaphthalene, phosphorus-containing phenol curing agents such as LC-950PM60 (manufactured by Shin-AT&C Co., Ltd.), phenol novolac resins such as Shonol BRG-555 (manufactured by Aica Kogyo Co., Ltd.), cresol novolac resins such as DC-5 (manufactured by NIPPON STEEL Chemical & Material Co., Ltd.), aromatic modified phenol novolac resins, bisphenol A novolac resins, trishydroxyphenylmethane-type novolac resins such as Resitop TPM-100 (manufactured by Gunei Chemical Industry Co., Ltd.), condensates of phenol compounds, naphthol compounds and/or bisphenol compounds with aldehyde compounds, such as naphthol novolac resins, condensates of phenol compounds, naphthol compounds and/or bisphenol compounds with xylylene glycols, such as SN-160, SN-395 and SN-485 (manufactured by NIPPON STEEL Chemical & Material Co., Ltd.), condensates of phenol compound and/or naphthol compounds with isopropenylacetophenone, reaction products of phenol compounds, naphthol compounds and/or bisphenol compounds with dicyclopentadienes, and condensates of phenol compounds, naphthol compounds and/or bisphenol compounds with biphenyl-based crosslinking agents. A phenol novolac resin, a dicyclopentadiene-type phenol resin, a trishydroxyphenylmethane-type novolac resin, an aromatic modified phenol novolac resin, and the like are preferable from the viewpoint of availability.

In the case of the novolac phenol resin, examples of the phenol compound include phenol, cresol, xylenol, butyl phenol, amylphenol, nonylphenol, butylmethylphenol, trimethylphenol, and phenylphenol, and examples of the naphthol compound include 1-naphthol and 2-naphthol, and further include the bisphenol compounds, as others. Examples of the aldehyde compound include formaldehyde, acetaldehyde, propylaldehyde, butylaldehyde, valeraldehyde, capronaldehyde, benzaldehyde, chloraldehyde, bromaldehyde, glyoxal, malonaldehyde, succinaldehyde, glutaraldehyde, adipinaldehyde, pimelinaldehyde, sebacinaldehyde, acrolein, crotonaldehyde, salicylaldehyde, phthalaldehyde and hydroxybenzaldehyde. Examples of the biphenyl-based crosslinking agent include bis(methylol)biphenyl, bis(methoxymethyl)biphenyl, bis(ethoxymethyl)biphenyl and bis(chloromethyl)biphenyl.

Specific examples of the acid anhydride-based curing agent include methyltetrahydrophthalic anhydride, hexahydrophthalic anhydride, pyromellitic anhydride, phthalic anhydride, trimellitic anhydride and methylnadic acid.

Specific examples of the amine-based curing agent include amine-based compounds such as diethylenetriamine, triethylenetetramine, m-xylenediamine, isophoronediamine, diaminodiphenylmethane, diaminodiphenylsulfone, diaminodiphenyl ether, benzyldimethylamine, 2,4,6-tris(dimethylaminomethyl)phenol, dicyandiamide, and polyamidoamine as a condensate of an acid compound such as a dimer acid with a polyamine compound.

Specific examples of other curing agents include phosphine compounds such as triphenylphosphine, phosphonium salts such as tetraphenylphosphonium bromide, imidazole compounds such as 2-methylimidazole, 2-phenylimidazole, 2-ethyl-4-methylimidazole, 2-undecylimidazole and 1-cyanoethyl-2-methylimidazole, imidazole salt compounds as salts of imidazole compounds with trimellitic acid, isocyanuric acid or boron, quaternary ammonium salts such as trimethylammonium chloride, diazabicyclo compounds, salt compounds of diazabicyclo compounds with phenol compounds or phenol novolac resin compounds, complex compounds of boron trifluoride with amine compounds or ether compounds, aromatic phosphonium or iodonium salts.

A known conventional epoxy resin curing accelerator can be, if necessary, used in the epoxy resin composition of the present invention. Examples of the curing accelerator that can be used include imidazole compounds such as 2-methylimidazole, 2-ethylimidazole, 2-ethyl-4-methylimidazole, 1-benzyl-2-methylimidazole, 2-heptadecylimidazole and 2-undecylimidazole, tertiary amine compounds such as 4-dimethylaminopyridine, 2-(dimethylaminomethyl)phenol and 1,8-diaza-bicyclo(5,4,0)undecene-7, urea compounds such as 3-phenyl-1,1-dimethylurea, 3-(4-methylphenyl)-1,1-dimethylurea, chlorophenylurea, 3-(4-chlorophenyl)-1,1-dimethylurea and 3-(3,4-dichlorophenyl)-1,1-dimethylurea, phosphine compounds such as triphenylphosphine, tributylphosphine, tricyclohexylphosphine and triphenylphosphine triphenylborane, and metal compounds such as tin octylate. Such curing accelerators may be used singly or in combinations of two or more kinds thereof. In particular, imidazole compounds are preferable.

When such a curing accelerator is used, the amount of use thereof may be appropriately selected depending on the intended use, and is, if necessary, 0.01 to 15 parts by mass, preferably 0.02 to 10 parts by mass, more preferably 0.05 to 8 parts by mass, further preferably 0.1 to 5 parts by mass based on 100 parts by mass of the epoxy resin component in the epoxy resin composition. Such a curing accelerator can be used to thereby decrease the curing temperature and shorten the curing time.

An organic solvent or a reactive diluent for viscosity adjustment can be used in the epoxy resin composition.

Examples of the organic solvent include amide compounds such as N,N-dimethylformamide and N,N-dimethylacetamide, ether compounds such as ethylene glycol monomethyl ether, dimethoxydiethylene glycol, ethylene glycol diethyl ether, diethylene glycol diethyl ether and triethylene glycol dimethyl ether, ketone compounds such as acetone, methyl ethyl ketone, methyl isobutyl ketone and cyclohexanone, alcohol compounds such as methanol, ethanol, 1-methoxy-2-propanol, 2-ethyl-1-hexanol, benzyl alcohol, ethylene glycol, propylene glycol, butyl diglycol and pine oil, acetate compounds such as butyl acetate, methoxybutyl acetate, methyl cellosolve acetate, cellosolve acetate, ethyl diglycol acetate, propylene glycol monomethyl ether acetate, carbitol acetate and benzyl alcohol acetate, benzoate compounds such as methyl benzoate and ethyl benzoate, cellosolve compounds such as methyl cellosolve, cellosolve and butyl cellosolve, carbitol compounds such as methylcarbitol, carbitol and butylcarbitol, aromatic hydrocarbon compounds such as benzene, toluene and xylene, dimethylsulfoxide, acetonitrile, and N-methylpyrrolidone, but not limited thereto.

Examples of the reactive diluent include monofunctional glycidyl ether compounds such as allyl glycidyl ether, butyl glycidyl ether, 2-ethylhexyl glycidyl ether, phenyl glycidyl ether and tolyl glycidyl ether, difunctional glycidyl ether compounds such as resorcinol diglycidyl ether, neopentyl glycol diglycidyl ether, 1,4-butane diol diglycidyl ether, 1,6-hexane diol diglycidyl ether, cyclohexane dimethanol diglycidyl ether and propylene glycol diglycidyl ether, polyfunctional glycidyl ether compounds such as glycerol polyglycidyl ether, trimethylolpropane polyglycidyl ether, trimethylolethane polyglycidyl ether and pentaerythritol polyglycidyl ether, glycidyl ester compounds such as neodecanoic acid glycidyl ester, and glycidyl amine compounds such as phenyl diglycidyl amine and tolyl diglycidyl amine, but not limited thereto.

Such organic solvents or reactive diluents are preferably used singly or as a mixture of a plurality of kinds thereof in a non-volatile content of 90% by mass or less, and the proper types and amounts of use thereof are appropriately selected depending on applications. For example, a polar solvent having a boiling point of 160° C. or less, such as methyl ethyl ketone, acetone or 1-methoxy-2-propanol is preferable in a printed-wiring board application, and the amount of use thereof, in terms of non-volatile content, is preferably 40 to 80% by mass. For example, a ketone compound, an acetate compound, a carbitol compound, an aromatic hydrocarbon compound, dimethylformamide, dimethylacetamide or N-methylpyrrolidone is preferably used in an adhesion film application, and the amount of use thereof, in terms of non-volatile content, is preferably 30 to 60% by mass.

Any other thermosetting resin or thermoplastic resin may be compounded in the epoxy resin composition as long as no characteristics are impaired. Examples include a phenol resin, an acrylic resin, a petroleum resin, an indene resin, a coumarone-indene resin, a phenoxy resin, a polyurethane resin, a polyester resin, a polyamide resin, a polyimide resin, a polyamideimide resin, a polyetherimide resin, a polyphenylene ether resin, a modified polyphenylene ether resin, a polyethersulfone resin, a polysulfone resin, a polyether ether ketone resin, a polyphenylene sulfide resin and a polyvinyl formal resin, but not limited thereto.

Various known flame retardants can be each used in the epoxy resin composition, for the purpose of an enhancement in flame retardance of a cured product obtained. Examples of such a usable flame retardant include a halogen-based flame retardant, a phosphorus-based flame retardant, a nitrogen-based flame retardant, a silicone-based flame retardant, an inorganic flame retardant and an organic metal salt-based flame retardant. A halogen-free flame retardant is preferable and a phosphorus-based flame retardant is particularly preferable, from the viewpoint of the environment. Such flame retardants may be used singly or in combinations of two or more kinds thereof.

The phosphorus-based flame retardant here used can be any of an inorganic phosphorus-based compound and an organic phosphorus-based compound. Examples of the inorganic phosphorus-based compound include red phosphorus, ammonium phosphate compounds such as monoammonium phosphate, diammonium phosphate, triammonium phosphate and ammonium polyphosphate, and inorganic nitrogen-containing phosphorus compounds such as phosphoric amide. Examples of the organic phosphorus-based compound include aliphatic phosphate, a phosphate compound, a condensed phosphate compound such as PX-200 (manufactured by Daihachi Chemical Industry Co., Ltd.), a phosphonic acid compound, a phosphinic acid compound, a phosphine oxide compound, a phosphorane compound, an universal organic phosphorus-based compound such as an organic nitrogen-containing phosphorus compound, and a metal salt of phosphinic acid, as well as a cyclic organic phosphorus compound such as 9,10-dihydro-9-oxa-10-phosphaphenanthrene-10-oxide, 10-(2,5-dihydrooxyphenyl)-10H-9-oxa-10-phosphaphenanthrene-10-oxide and 10-(2,7-dihydrooxynaphthyl)-10H-9-oxa-10-phosphaphenanthrene-10-oxide, and a phosphorus-containing epoxy resin and a phosphorus-containing curing agent which are derivatives each obtained by a reaction of such a cyclic organic phosphorus compound with a compound such as an epoxy resin or a phenol resin.

The amount of compounding of the flame retardant is appropriately selected depending on the type of the phosphorus-based flame retardant, each component of the epoxy resin composition, and the desired degree of flame retardance. For example, the phosphorus content in the organic component (except for the organic solvent) in the epoxy resin composition is preferably 0.2 to 4% by mass, more preferably 0.4 to 3.5% by mass, further preferably 0.6 to 3% by mass. A low phosphorus content may make it difficult to ensure flame retardance, and a too high phosphorus content may have an adverse effect on heat resistance. When the phosphorus-based flame retardant is used, a flame retardant aid such as magnesium hydroxide may be used in combination.

A filler can be, if necessary, used in the epoxy resin composition. Specific examples include molten silica, crystalline silica, alumina, silicon nitride, aluminum hydroxide, boehmite, magnesium hydroxide, talc, mica, calcium carbonate, calcium silicate, calcium hydroxide, magnesium carbonate, barium carbonate, barium sulfate, boron nitride, carbon, a carbon fiber, a glass fiber, an alumina fiber, a silica/alumina fiber, a silicon carbide fiber, a polyester fiber, a cellulose fiber, an aramid fiber, a ceramic fiber, fine particle rubber, a thermoplastic elastomer and a pigment. Examples of the reason for use of the filler generally include the effect of an enhancement in impact resistance. When a metal hydroxide such as aluminum hydroxide, boehmite or magnesium hydroxide is used, it has the effect of acting as a flame retardant aid and enhancing flame retardance. The amount of compounding of such a filler is preferably 1 to 150% by mass, more preferably 10 to 70% by mass based on the entire of the epoxy resin composition. A large amount of compounding may cause deterioration in adhesiveness necessary for a laminated board application and furthermore may result in a brittle cured product and impart no sufficient mechanical properties. A small amount of compounding is liable not to have any effect by compounding of a filler, for example, an enhancement in impact resistance of a cured product.

Into the epoxy resin composition, various additives such as a silane coupling agent, an antioxidant, a release agent, a defoamer, an emulsifier, a thixotropy imparting agent, a lubricating agent, a flame retardant and a pigment can be further compounded, if necessary. The amount of compounding of such an additive is preferably in the range of 0.01 to 20% by mass relative to the epoxy resin composition.

The epoxy resin composition of the present invention is obtained by uniformly mixing the above components. The epoxy resin composition, in which the active ester resin, the epoxy resin, and further, if necessary, various materials are compounded, can be cured by the same method as in a known epoxy resin composition, to obtain an epoxy resin-cured product. Examples of the cured product include formed cured products such as a laminated product, a cast molded product, a shaped product, an adhesion layer, an insulation layer and a film. The method for obtaining the cured product can be the same method as in a known epoxy resin composition, and a method suitably used is, for example, a method for obtaining a laminated board by, for example, cast molding, injection, potting, dipping, drip coating, transfer molding or compression molding, or lamination of a form of, for example, a resin sheet, copper foil provided with a resin, or prepreg, and then curing with heating and pressurizing.

In the method for curing the epoxy resin composition, usually the curing temperature is 80 to 300° C. and the curing time is 10 to 360 minutes, while depend on the compounding components in the epoxy resin composition and the amounts of compounding thereof. The heating is preferably performed at two stages of primary heating at 80 to 180° C. for 10 to 90 minutes and secondary heating at 120 to 200° C. for 60 to 150 minutes, and tertiary heating at 150 to 280° C. for 60 to 120 minutes is preferably further performed in a compounding system where the glass transition temperature (Tg) is more than the temperature in the secondary heating. Such secondary heating and tertiary heating can be performed to thereby reduce insufficient curing. When a semi-cured product of a resin, such as a resin sheet, copper foil provided with a resin, or a prepreg is produced, the curing reaction of the epoxy resin composition is usually allowed to progress in such an extent that a shape is kept by heating or the like. When the epoxy resin composition includes a solvent, most of the solvent is usually removed by a procedure such as heating, depressurizing, or air drying, but 5% by mass or less of the solvent may be allowed to remain in the semi-cured product of a resin.

The epoxy resin composition can be applied for use in various fields of a material for a circuit substrate, a sealing material, a cast molding material, a conductive paste, an adhesive, an insulation material, and the like, and is particularly useful in, for example, insulation cast molding, a lamination material and a sealing material in the electrical and electronic field. Application examples thereof include a printed-wiring substrate, a flexible wiring substrate, a laminated board for electrical and electronic circuits such as a capacitor, resin-attached metal foil, an adhesive such as a film-like adhesive and a liquid adhesive, a semiconductor sealing material, an underfill material, an inter chip fill material for 3D-LSI, an insulation material for a circuit substrate, an insulation sheet, a prepreg, a heat dissipation substrate, and a resist ink, but not limited thereto at all.

The epoxy resin composition can be used in a printed-wiring board material or an insulation material for a circuit substrate, among such various applications, or in an insulation material for a substrate for so-called electronic component embedding where a passive component such as a capacitor and an active component such as an IC chip are embedded in a substrate, in an adhesion film application for build-up. In particular, the epoxy resin composition is preferably used in a material for a circuit substrate (laminated board) and a semiconductor sealing material, for example, a printed-wiring board material, an epoxy resin composition for a flexible wiring substrate, an interlayer insulation material for a build-up substrate, in view of the characteristics such as high flame retardance, high heat resistance, and solvent solubility.

When the epoxy resin composition is formed into a plate such as a laminated board, a filler here used is preferably fibrous in terms of dimension stability and bending strength, and is more preferably a glass fabric, a glass mat, or a glass roving fabric.

A fibrous reinforcement base material can be impregnated with the epoxy resin composition, to thereby produce a prepreg for use in a printed-wiring board or the like. The fibrous reinforcement base material here used can be, for example, a woven fabric or a non-woven fabric of an inorganic fiber such as glass, or an organic fiber such as a polyester resin, a polyamine resin, a polyacrylic resin, a polyimide resin or an aromatic polyamide resin, but not limited thereto.

The method for producing the prepreg from the epoxy resin composition is not particularly limited, and the prepreg is obtained by, for example, forming a resin varnish in which the viscosity of the epoxy resin composition is adjusted by an organic solvent to an appropriate viscosity, impregnating the fibrous reinforcement base material with the resin varnish and then heating and drying the resultant, thereby semi-curing (B-staging) a resin component. The heating temperature is preferably 50 to 200° C., more preferably 100 to 170° C., depending on the type of the organic solvent used. The heating time is adjusted depending on the type of the organic solvent used and the curability of the prepreg, and is preferably 1 to 40 minutes, more preferably 3 to 20 minutes. The mass ratio between the epoxy resin composition and the reinforcement base material used is not particularly limited, and is usually preferably adjusted so that the resin content in the prepreg is 20 to 80% by mass.

The epoxy resin composition of the present invention can be formed into a sheet or film, and thus used. In this case, such a sheet or film can be formed by using a conventionally known method. The method for producing such a resin sheet is not particularly limited, and examples include (i) an extrusion method involving kneading and then extruding the epoxy resin composition in an extruder, and forming the resultant into a sheet by use of a T-die, a circular die or the like, (ii) a casting molding method involving dissolving or dispersing the epoxy resin composition in a solvent such as an organic solvent, and then casting and molding the resultant into a sheet, and (iii) other conventionally known sheet formation methods. The thickness (μm) of such a resin sheet is not particularly limited, and is preferably 10 to 300, more preferably 25 to 200, further preferably 40 to 180. The thickness of such a resin sheet in the case of use in a build-up method is particularly preferably 40 to 90 μm. A thickness of 10 μm or more can allow insulation properties to be obtained, and a thickness of 300 μm or less allows the circuitry distance between electrodes not to be unnecessarily elongated. The content of the solvent in such a resin sheet is not particularly limited, and is preferably 0.01 to 5% by mass based on the entire of the epoxy resin composition. When the content of solvent in such a film is 0.01% by mass or more based on the entire of the epoxy resin composition, cohesiveness and adhesiveness are easily obtained in lamination onto a circuit substrate, and when the content is 5% by mass or less, flatness after thermal curing is easily obtained.

A more specific method for producing an adhesive sheet is a method involving coating a support base film not dissolved in any organic solvent with the above varnish-like epoxy resin composition including the organic solvent, by use of a coating machine such as a reverse roll coater, a comma coater or a die coater, and then heating and drying the resultant, thereby B-staging a resin component. Another support base film is, if necessary, stacked as a protective film on a coating surface (adhesive layer), and dried, and thus an adhesive sheet is obtained which has a release layer on each of surfaces of the adhesive layer.

Examples of such a support base film include metal foil such as copper foil, a polyolefin film such as a polyethylene film and a polypropylene film, a polyester film such as a polyethylene terephthalate film, a polycarbonate film, a silicone film, and a polyimide film, and in particular, a polyethylene terephthalate film is preferable which does not have any defect such as graining and which is excellent in dimension accuracy and also excellent in terms of cost. Any metal foil which facilitates multi-layering of a laminated board, in particular, copper foil is preferable. The thickness of such a support base film is not particularly limited, and is preferably 10 to 150 μm, more preferably 25 to 50 μm, because strength of a support is achieved and insufficient lamination is hardly caused.

The thickness of the protective film is not particularly limited, and is generally 5 to 50 μm. A surface treatment with a release agent is preferably applied in advance for easy release of an adhesive sheet shaped. The thickness of coating with the resin varnish, in terms of thickness after drying, is preferably 5 to 200 μm, more preferably 5 to 100 μm.

The heating temperature is preferably 50 to 200° C., more preferably 100 to 170° C., depending on the type of the organic solvent used. The heating time is adjusted depending on the type of the organic solvent used and the curability of the prepreg, and is preferably 1 to 40 minutes, more preferably 3 to 20 minutes.

The resin sheet thus obtained usually serves as an insulation adhesive sheet having insulation properties, or a conductive adhesive sheet can also be obtained by mixing with the epoxy resin composition, a metal or a fine particle coated with a metal, having conductivity. The support base film is released after lamination onto a circuit substrate or after thermal curing for formation of an insulation layer. The support base film can be released after thermal curing of such an adhesive sheet to thereby prevent contaminations or the like from being attached in a curing step. The insulation adhesive sheet also serves as an insulation sheet.

The resin-attached metal foil, obtained from the epoxy resin composition of the present invention, is described. The metal foil here used can be any foil of a single metal, an alloy, and a composite, such as copper, aluminum, brass, and nickel. Metal foil having a thickness of 9 to 70 μm is preferably used. The method for producing the resin-attached metal foil from the epoxy resin composition of the present invention and metal foil is not particularly limited, and the resin-attached metal foil can be obtained by, for example, coating one surface of the metal foil with a resin varnish in which the viscosity of the epoxy resin composition is adjusted by a solvent, by use of a roll coater or the like, and then heating and drying the resultant, thereby semi-curing (B-staging) a resin component to form a resin layer. When the resin component is semi-cured, heating and drying can be made, for example, at 100 to 200° C. for 1 to 40 minutes. The resin-attached metal foil is preferably formed so that the thickness of a resin portion thereof is 5 to 110 μm.

The curing of the prepreg or the insulation adhesive sheet can be made by using a method for curing a laminated board, generally used in production of a printed-wiring board, but not limited thereto. For example, when a laminated board is formed using the prepreg, such a laminated board can be obtained by laminating one or more of the prepregs, placing metal foil on one of or both sides of the prepregs to thereby form a laminated product, and pressurizing and heating the laminated product to thereby cure and integrate the prepregs. The metal foil here used can be any foil of a single metal, an alloy, and a composite, such as copper, aluminum, brass, and nickel.

Conditions of heating and pressurizing the laminated product may be appropriately adjusted so as to allow the heating and pressurizing to be made under conditions that allow for curing of the epoxy resin composition, but, if the amount of pressure applied is too small, bubbles may remain in a laminated board obtained, to result in deterioration in electric characteristics, and thus the pressurizing is preferably made under conditions that allow shaping properties to be satisfied. The heating temperature is preferably 160 to 250° C., more preferably 170 to 220° C. The pressure applied is preferably 0.5 to 10 MPa, more preferably 1 to 5 MPa. The heating and pressurizing time is preferably 10 minutes to 4 hours, more preferably 40 minutes to 3 hours. A low heating temperature may cause progression of no sufficient reaction, and a high heating temperature may cause pyrolysis of a cured product. A low pressure applied may cause bubbles to remain in such a laminated board to result in deterioration in electric characteristics, and a high pressure applied may cause resin flowing before curing, not providing a laminated board having a desired thickness. A short heating and pressurizing time may cause progression of no sufficient reaction, and a long heating and pressurizing time may cause pyrolysis of a cured product.

Furthermore, a single-layered laminated board thus obtained can serve as an inner layer material, to thereby produce a multi-layered board. In this case, first, the laminated board is subjected to circuit formation according to an additive method, a subtractive method or the like, and a circuit-formed surface is blackened by a treatment with an acid solution, to thereby provide an inner layer material. An insulation layer is formed on one of or both sides of the inner layer material, corresponding to the circuit-formed surface, with the prepreg, resin sheet, insulation adhesive sheet or resin-attached metal foil, and also a conductor layer is formed on a surface of the insulation layer, thereby forming a multi-layered board.

When the insulation layer is formed by using the prepreg, one or more of the prepregs laminated are placed on the circuit-formed surface of the inner layer material, and metal foil is further placed on an outer side of the prepregs, thereby forming a laminated body. The laminated body is heated and pressurized to obtain an integrated shape, thereby not only forming a cured product of the prepregs, as the insulation layer, but also forming the metal foil located on the outer side, as the conductor layer. The metal foil here used can be the same as that used in the laminated board for use as the inner layer material. Such formation by heating and pressurizing can be performed under the same conditions as those in shaping of the inner layer material. A surface of a multi-layered laminated board thus formed can be further subjected to via hole formation and circuit formation according to an additive method and a subtractive method, to thereby shape a printed-wiring board. The above operations can be repeated with the printed-wiring board as the inner layer material, to thereby form a multi-layered board further multi-layered.

For example, when the insulation layer is formed from the insulation adhesive sheet, the insulation adhesive sheet is placed on each circuit-formed surface of a plurality of the inner layer materials, to thereby form a laminated product. Alternatively, the insulation adhesive sheet is placed between the circuit-formed surface of the inner layer material and the metal foil, to thereby form a laminated product. The laminated product is heated and pressurized to obtain an integrated shape, thereby not only forming a cured product of the insulation adhesive sheet, as the insulation layer, but also forming a multi-layered inner layer material. Alternatively, a cured product of the insulation adhesive sheet is formed as the insulation layer between the inner layer material and the metal foil as the conductor layer. The metal foil here used can be the same as that used in the laminated board for use as the inner layer material. Such formation by heating and pressurizing can be performed under the same conditions as those in shaping of the inner layer material.

When the insulation layer is formed by coating the laminated board with the epoxy resin composition, the epoxy resin composition is applied so that the thickness is preferably 5 to 100 μm, and then heated and dried at 100 to 200° C., preferably 150 to 200° C., for 1 to 120 minutes, preferably 30 to 90 minutes, to thereby form a sheet. Such formation is made by a method commonly called casting method. Such formation is preferably made so that the thickness after drying is 5 to 150 μm, preferably 5 to 80 μm. The viscosity at 25° C. of the epoxy resin composition is preferably 10 to 40000 mPa·s, further preferably 200 to 30000 mPa·s, because a sufficient thickness is obtained and the variation in painting and streaks hardly occur. A surface of a multi-layered laminated board thus formed can be further subjected to via hole formation and circuit formation according to an additive method and a subtractive method, to thereby form a printed-wiring board. The above operations can be repeated with the printed-wiring board as the inner layer material, to thereby form a laminated board further multi-layered.

A sealing material obtained by using the epoxy resin composition of the present invention is, for example, for a tape-like semiconductor chip, for potting-type liquid sealing, for underfill or for a semiconductor interlayer insulation film, and can be suitably used therefor. Examples of semiconductor package molding include a method for obtaining a molded product by molding the epoxy resin composition by cast molding, or a transfer molding machine or an injection molding machine, and furthermore drying the resultant at 50 to 200° C. for 2 to 10 hours.

An epoxy resin composition for a semiconductor sealing material is prepared by a procedure involving preliminarily mixing additive(s), if necessary, compounded in such an epoxy resin composition, for example, a compounding agent such as an inorganic filler, a coupling agent and/or a release agent, and then sufficiently melting and mixing the resultant by use of an extruder, a kneader, a roll or the like until uniformity is obtained. Here, silica is usually used as an inorganic filler, and in this case, the inorganic filler is preferably compounded so that the proportion thereof in such an epoxy resin composition is 70 to 95% by mass.

When such an epoxy resin composition thus obtained is used as a tape-like sealing material, a method can be exemplified which includes heating such an epoxy resin composition to thereby produce a semi-cured sheet and form the sheet into a sealing material tape, then disposing the sealing material tape on a semiconductor chip and heating the tape to 100 to 150° C. for softening and molding, and completely curing the resultant at 170 to 250° C. Such an epoxy resin composition obtained, when used in a potting-type liquid sealing material, may be, if necessary, dissolved in a solvent, and then applied onto a semiconductor chip and an electronic component and directly cured.

Furthermore, the epoxy resin composition of the present invention can also be used in a resist ink. In this case, a method is exemplified which includes compounding a vinyl monomer having an ethylenically unsaturated double bond and a cationic polymerization catalyst as a curing agent, with the epoxy resin composition, further adding a pigment, talc, and/or a filler to thereby provide a composition for a resist ink, and coating a printed substrate with the composition in a screen printing manner and then forming a cured product of a resist ink. The curing temperature here preferably ranges from about 20 to 250° C.

The epoxy resin composition is produced, and heated and cured, and a laminated board and a cured product are evaluated, and as a result, the cured product exhibits excellent low-dielectric properties, and furthermore an epoxy resin composition excellent in copper foil peel strength and interlayer cohesion strength in a printed-wiring board application can be provided.

EXAMPLES

The present invention is specifically described with reference to Examples and Comparative Examples, but the present invention is not limited thereto. Unless particularly noted, "parts" represents "parts by mass", "%" represents "% by mass", and "ppm" represents "ppm by mass". Measurement methods were respectively the following measurement methods.

Hydroxyl equivalent: measured in accordance with JIS K 0070 standard, where the unit was expressed by "g/eq.". Unless particularly noted, the hydroxyl equivalent of an aromatic polyvalent hydroxy compound means the phenolic hydroxyl equivalent.

Softening point: measured in accordance with a ring-and-ball method in JIS K 7234 standard. Specifically, an automatic softening point apparatus (ASP-MG4 manufactured by Meitech Company, Ltd.) was used.

Copper foil peel strength and interlayer adhesion force: measured in accordance with JIS C 6481. The interlayer adhesion force was measured by pulling and peeling between the seventh layer and the eighth layer.

Relative permittivity and dielectric tangent: evaluated by determining the relative permittivity and the dielectric tangent at a frequency of 1 GHz by a capacitance method according to IPC-TM-650 2.5.5.9 by use of a material analyzer (manufactured by AGILENT Technologies).

GPC (gel permeation chromatography) measurement: columns (TSKgelG4000H$_{XL}$, TSKgelG3000H$_{XL}$ and TSKgelG2000H$_{XL}$ manufactured by Tosoh Corporation) connected to the main body (HLC-8220 GPC manufactured by Tosoh Corporation) in series were used, and the column temperature was 40° C. The eluent here used was tetrahydrofuran (THF) at a flow rate of 1 mL/min, and the detector here used was a differential refractive index detector. The measurement specimen here used was 50 μL of one obtained by dissolving 0.1 g of a sample in 10 mL of THF and filtering the solution by a micro filter. GPC-8020 Model II version 6.00 manufactured by Tosoh Corporation was used for data processing.

IR: the absorbance at a wavenumber of 650 to 4000 cm$^{-1}$ was measured with a Fourier transform infrared spectrometer (Spectrum One FT-IR Spectrometer 1760X manufactured by Perkin Elmer Precisely) and KRS-5 as a cell by coating the cell with a sample dissolved in THE and drying the resultant.

ESI-MS: mass analysis was performed by subjecting a sample dissolved in acetonitrile to measurement with a mass spectrometer (LCMS-2020 manufactured by Shimadzu Corporation) by use of acetonitrile and water in a mobile phase.

Abbreviations used in Examples and Comparative Examples are as follows.

[Aromatic Hydroxy Compound]
- P1: Aromatic hydroxy compound obtained in Synthesis Example 1
- P2: Aromatic hydroxy compound obtained in Synthesis Example 2
- P3: Aromatic hydroxy compound obtained in Synthesis Example 3
- P4: Aromatic hydroxy compound obtained in Synthesis Example 4
- P5: Aromatic hydroxy compound obtained in Synthesis Example 5
- P6: Aromatic hydroxy compound obtained in Reference Example 1
- P7: 1-Naphthol

[Aromatic Carboxylic Acid Halide]
- B1: Isophthalic acid chloride
- B2: Terephthalic acid chloride
- B3: Benzoyl chloride

[Epoxy Resin]
- E1: Phenol/dicyclopentadiene-type epoxy resin (KDCP-130 manufactured by Kukdo Chemical Co., Ltd., epoxy equivalent 254, softening point 72° C.)

[Curing Agent]
- A1: Active ester resin obtain in Example 1
- A2: Active ester resin obtain in Example 2
- A3: Active ester resin obtain in Example 3
- A4: Active ester resin obtain in Example 4
- A5: Active ester resin obtain in Example 5
- A6: Active ester resin obtain in Example 6
- A7: Active ester resin obtain in Example 7
- A8: Active ester resin obtain in Example 8
- A9: Active ester resin obtain in Example 9
- A10: Active ester resin obtain in Example 10
- A11: Active ester resin obtain in Reference Example 2
- P8: Phenol novolac resin (Shonol BRG-557 manufactured by Aica Kogyo Co., Ltd., hydroxyl equivalent 105, softening point 80° C.)

[Curing Accelerator]
- C1: 4-Dimethylaminopyridine (manufactured by Kishida Chemical Co., Ltd.)

Synthesis Example 1

Figure 2:
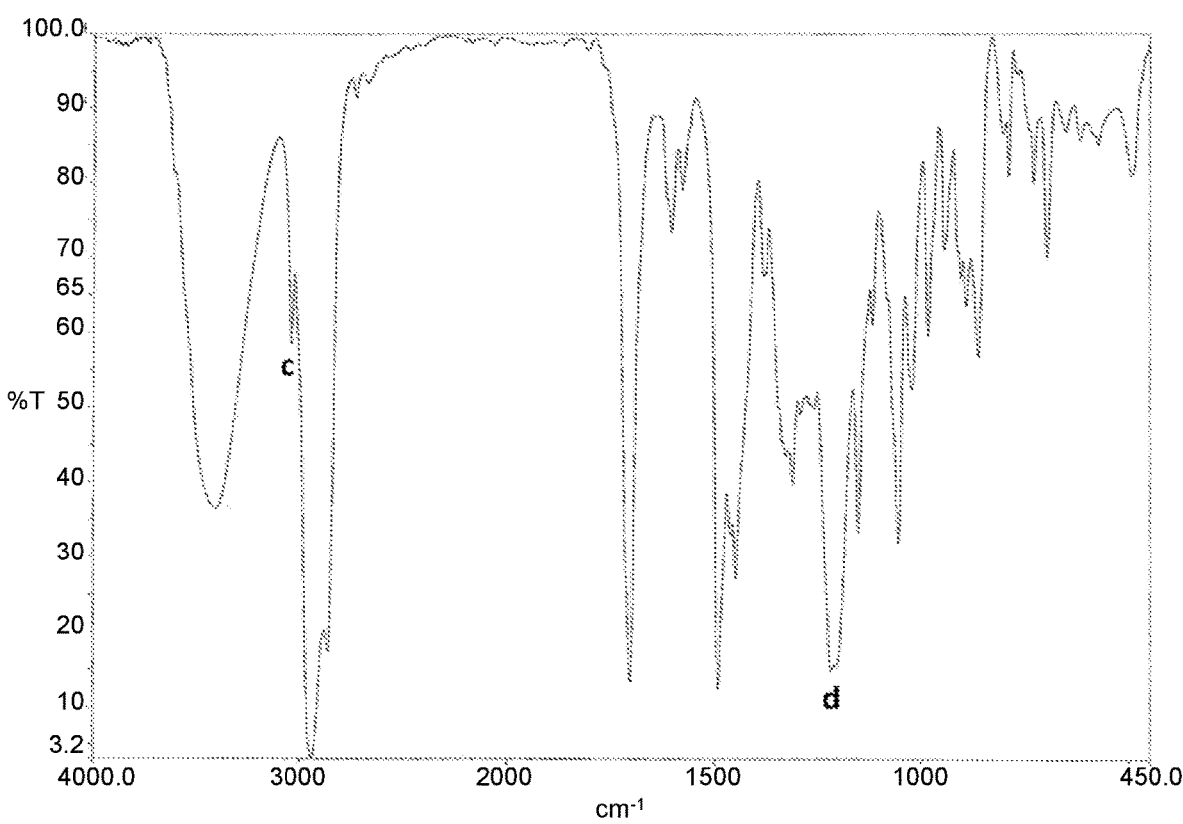
FIG. 2 An IR chart of the aromatic hydroxy compound obtained in Synthesis Example 1.

A reaction apparatus including a separable flask made of glass, equipped with a stirrer, a thermometer, a nitrogen blowing tube, a dropping funnel and a cooling tube was loaded with 95.0 parts of 2,6-xylenol and 4.7 parts of a 47% BF$_3$ ether complex (0.075-fold moles relative to dicyclopentadiene), and the resulting mixture was warmed to 70° C. with stirring. While this temperature was kept, 58.8 parts of dicyclopentadiene (0.57-fold moles relative to 2,6-xylenol) was dropped for 1 hour. Furthermore, the reaction was made at a temperature of 115 to 125° C. for 4 hours. Thereto was added 7.4 parts of calcium hydroxide. Furthermore, 23 parts of an aqueous 10% oxalic acid solution was added. Thereafter, the resultant was warmed to 160° C. for dehydration, and thereafter warmed to 200° C. under a reduced pressure of 5 mmHg, to thereby evaporate and remove the unreacted raw material. A product was dissolved by addition of 360 parts of methyl isobutyl ketone (MIBK), and washed with water by addition of 100 parts of warm water at 80° C., and an aqueous layer as the lower layer was separated and removed. Thereafter, MIBK was evaporated and removed by warming to 160° C. under a reduced pressure of 5 mmHg, and thus 136 parts of red-brown aromatic polyvalent hydroxy compound (P1) was obtained. The hydroxyl equivalent was 213, the softening point was 87° C., and the absorption ratio ($A_{3040}/A_{1210}$) was 0.12. A mass spectrum by ESI-MS (negative) was measured, and the following was confirmed: M-=253, 375, 507, 629. The results of GPC and FT-IR of aromatic hydroxy compound (P1) obtained are respectively illustrated in FIG. 1 and FIG. 2. In FIG. 1, a is assigned to a mixture of a u=1 form of formula (7) and a u=1 form having no R$^2$ adduct, of formula (7), and b is assigned to a u=0 form of formula (7). The content of the u=0 form was 10.4% by area. In FIG. 2, c corresponds to a peak assigned to C—H stretching vibration of an olefin moiety of a dicyclopentadiene backbone, and d means absorption due to C—O stretching vibration of a phenol nucleus.

Synthesis Example 2

The same reaction apparatus as in Synthesis Example 1 was loaded with 95.0 parts of 2,6-xylenol and 3.2 parts of a 47% BF$_3$ ether complex (0.05-fold moles relative to dicyclopentadiene), and the resulting mixture was warmed to 70° C. with stirring. While this temperature was kept, 58.8 parts of dicyclopentadiene (0.57-fold moles relative to 2,6-xylenol) was dropped for 1 hour. Furthermore, the reaction was made at a temperature of 115 to 125° C. for 4 hours. Thereto was added 5.0 parts of calcium hydroxide. Furthermore, 15 parts of an aqueous 10% oxalic acid solution was added. Thereafter, the resultant was warmed to 160° C. for dehydration, and thereafter warmed to 200° C. under a reduced pressure of 5 mmHg, to thereby evaporate and remove the unreacted raw material. A product was dissolved by addition of 360 parts of MIBK, and washed with water by addition of 100 parts of warm water at 80° C., and an aqueous layer as the lower layer was separated and removed. Thereafter, MIBK was evaporated and removed by warming to 160° C. under a reduced pressure of 5 mmHg, and thus 129 parts of red-brown aromatic hydroxy compound (P2) was obtained. The hydroxyl equivalent was 224, the softening point was 66° C., and the absorption ratio ($A_{3040}/A_{1210}$) was 0.21. A mass spectrum by ESI-MS (negative) was measured, and the following was confirmed: M-=253, 375, 507, 629. The content of the u=0 form was 27.8% by area.

Synthesis Example 3

The same reaction apparatus as in Synthesis Example 1 was loaded with 95.0 parts of 2,6-xylenol and 1.6 parts of a 47% BF$_3$ ether complex (0.025-fold moles relative to dicyclopentadiene), and the resulting mixture was warmed to 70° C. with stirring. While this temperature was kept, 58.8 parts of dicyclopentadiene (0.57-fold moles relative to 2,6-xylenol) was dropped for 1 hour. Furthermore, the reaction was made at a temperature of 115 to 125° C. for 4 hours. Thereto was added 2.5 parts of calcium hydroxide. Furthermore, 8 parts of an aqueous 10% oxalic acid solution was added. Thereafter, the resultant was warmed to 160° C. for dehydration, and thereafter warmed to 200° C. under a reduced pressure of 5 mmHg, to thereby evaporate and remove the unreacted raw material. A product was dissolved by addition of 360 parts of MIBK, and washed with water by addition of 100 parts of warm water at 80° C., and an aqueous layer as the lower layer was separated and removed. Thereafter, MIBK was evaporated and removed by warming to 160° C. under a reduced pressure of 5 mmHg, and thus 113 parts of red-brown aromatic hydroxy compound (P3) was obtained. The hydroxyl equivalent was 255, the resin was semi-solid at room temperature, and the absorption ratio ($A_{3040}/A_{1210}$) was 0.51. A mass spectrum by ESI-MS (negative) was measured, and the following was confirmed: M-=253, 375, 507, 629. The content of the u=0 form was 72.3% by area.

Synthesis Example 4

The same reaction apparatus as in Synthesis Example 1 was loaded with 140 parts of 2,6-xylenol and 9.3 parts of a 47% $BF_3$ ether complex (0.1-fold moles relative to dicyclopentadiene initially added), and the resulting mixture was warmed to 110° C. with stirring. While this temperature was kept, 86.6 parts of dicyclopentadiene (0.57-fold moles relative to 2,6-xylenol) was dropped for 1 hour. Furthermore, the reaction was made at a temperature of 110° C. for 3 hours, and thereafter, while this temperature was kept, 68 parts of dicyclopentadiene (0.44-fold moles relative to 2,6-xylenol) was dropped for 1 hour. Furthermore, the reaction was made at a temperature of 120° C. for 2 hours. Thereto was added 14.6 parts of calcium hydroxide. Furthermore, 45 parts of an aqueous 10% oxalic acid solution was added. Thereafter, the resultant was warmed to 160° C. for dehydration, and thereafter warmed to 200° C. under a reduced pressure of 5 mmHg, to thereby evaporate and remove the unreacted raw material. A product was dissolved by addition of 700 parts of MIBK, and washed with water by addition of 200 parts of warm water at 80° C., and an aqueous layer as the lower layer was separated and removed. Thereafter, MIBK was evaporated and removed by warming to 160° C. under a reduced pressure of 5 mmHg, and thus 274 parts of red-brown aromatic hydroxy compound (P4) was obtained. The hydroxyl equivalent was 299, the resin had a softening point of 97° C., and the absorption ratio ($A_{3040}/A_{1210}$) was 0.17. A mass spectrum by ESI-MS (negative) was measured, and the following was confirmed: M-=253, 375, 507, 629. The content of the u=0 form was 6.5% by area.

Synthesis Example 5

The same reaction apparatus as in Synthesis Example 1 was loaded with 140 parts of 2,6-xylenol and 9.3 parts of a 47% $BF_3$ ether complex (0.1-fold moles relative to dicyclopentadiene initially added), and the resulting mixture was warmed to 110° C. with stirring. While this temperature was kept, 86.6 parts of dicyclopentadiene (0.57-fold moles relative to 2,6-xylenol) was dropped for 1 hour. Furthermore, the reaction was made at a temperature of 110° C. for 3 hours, and thereafter, while this temperature was kept, 90.6 parts of dicyclopentadiene (0.60-fold moles relative to 2,6-xylenol) was dropped for 1 hour. Furthermore, the reaction was made at a temperature of 120° C. for 2 hours. Thereto was added 14.6 parts of calcium hydroxide. Furthermore, 45 parts of an aqueous 10% oxalic acid solution was added. Thereafter, the resultant was warmed to 160° C. for dehydration, and thereafter warmed to 200° C. under a reduced pressure of 5 mmHg, to thereby evaporate and remove the unreacted raw material. A product was dissolved by addition of 740 parts of MIBK, and washed with water by addition of 200 parts of warm water at 80° C., and an aqueous layer as the lower layer was separated and removed. Thereafter, MIBK was evaporated and removed by warming to 160° C. under a reduced pressure of 5 mmHg, and thus 310 parts of red-brown aromatic hydroxy compound (P5) was obtained. The hydroxyl equivalent was 341, the resin had a softening point of 104° C., and the absorption ratio ($A_{3040}/A_{1210}$) was 0.27. A mass spectrum by ESI-MS (negative) was measured, and the following was confirmed: M-=253, 375, 507, 629. The content of the u=0 form was 5.94% by area.

Reference Example 1

Figure 5:
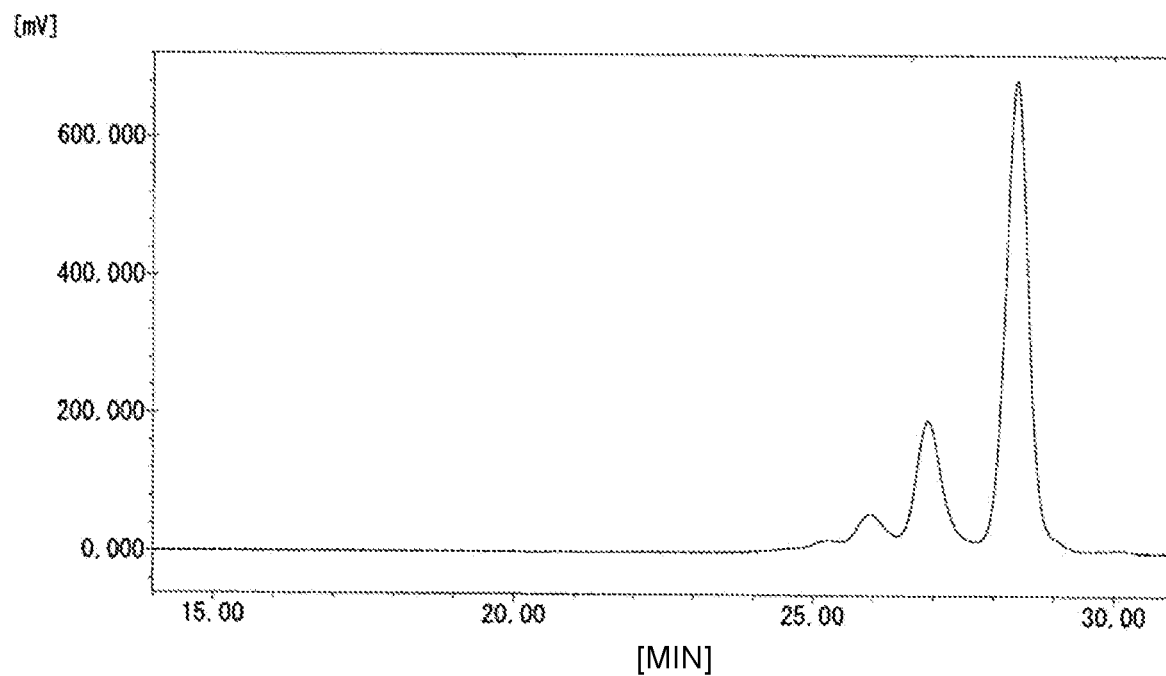
FIG. 5 A GPC chart of an aromatic hydroxy compound obtained in Reference Example 1.

The same reaction apparatus as in Synthesis Example 1 was loaded with 400 parts of phenol and 7.5 parts of a 47% $BF_3$ ether complex, and the resulting mixture was warmed to 70° C. with stirring. While this temperature was kept, 70.2 parts of dicyclopentadiene was dropped for 2 hours. Furthermore, the reaction was made at a temperature of 125 to 135° C. for 4 hours, and 11.7 parts of calcium hydroxide was added thereto. Furthermore, 35 parts of an aqueous 10% oxalic acid solution was added. Thereafter, the resultant was warmed to 160° C. for dehydration, and thereafter warmed to 200° C. under a reduced pressure of 5 mmHg, to thereby evaporate and remove the unreacted raw material. A product was dissolved by addition of 1097 parts of MIBK, and washed with water by addition of 108 parts of 80° C. at warm water, and an aqueous layer as the lower layer was separated and removed. Thereafter, MIBK was evaporated and removed by warming to 160° C. under a reduced pressure of 5 mmHg, and thus 158 parts of red-brown aromatic hydroxy compound (P6) was obtained. The hydroxyl equivalent was 177 and the softening point was 92° C. A mass spectrum by ESI-MS (negative) was measured, and the following was confirmed: M-=319, 545; but the following was not confirmed: M-=225, 451, corresponding to a structure to which the substituent of the formula (1a) or formula (1b) was added. The proportion of the dicyclopentadiene reacted was 100%. The results of GPC of aromatic polyvalent hydroxy compound (P6) obtained are illustrated in FIG. 5. No u=0 form was included.

Example 1

Figure 3:
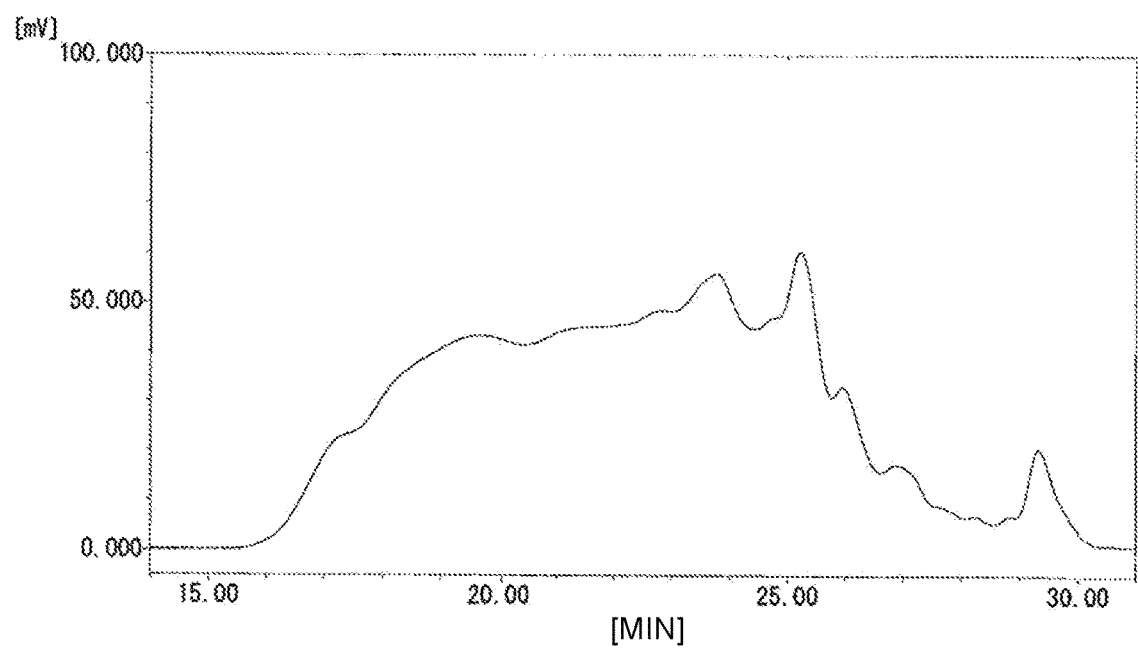
FIG. 3 A GPC chart of an active ester resin obtained in Example 1.
Figure 4:
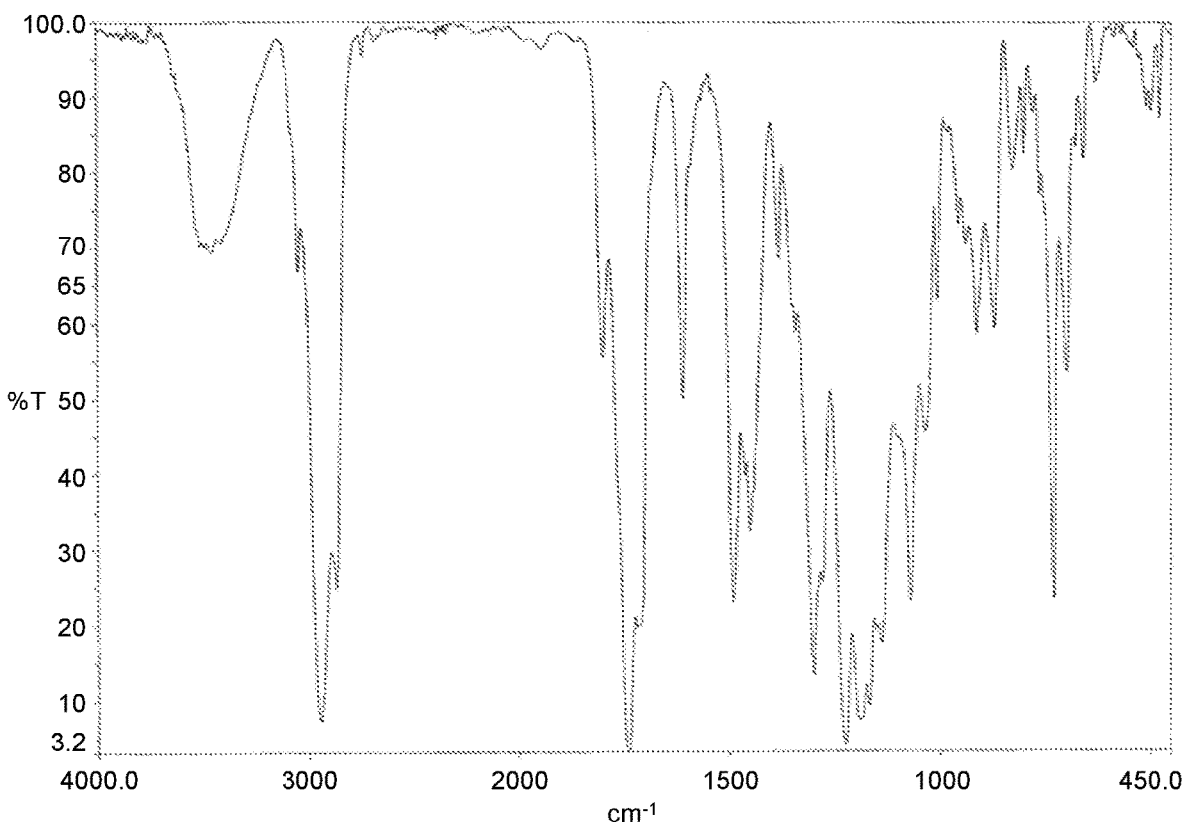
FIG. 4 An IR chart of the active ester resin obtained in Example 1.

A reaction apparatus equipped with a stirrer, a thermometer, a nitrogen blowing tube, a dropping funnel and a cooling tube was loaded with 100 parts of P1 as an aromatic hydroxy compound, 0.01 parts of tetra-n-butylammonium bromide (TBAB), 47.8 parts of B1 as an aromatic carboxylic acid halide, and 369 parts of toluene (TL), and the resulting mixture was heated to 50° C. and dissolved. While the system was controlled at 60° C. or less, 94.1 parts of an aqueous 20% sodium hydroxide solution (20% NaOH) was dropped for 3 hours and thereafter stirring was continued at the temperature for 1 hour. The reaction mixture was left to still stand and separated, and an aqueous layer was removed. The operation was repeated until the pH of the aqueous layer reached 7. Thereafter, the water content was removed by dehydration under reflux, and thus 171 parts of active ester resin (A1) in the form of a toluene solution having a non-volatile content of 65% was obtained. The active ester equivalent calculated from the amount of loading of each raw material was 279. The results of GPC and FT-IR of active ester resin (A1) obtained are respectively illustrated in FIG. 3 and FIG. 4.

Examples 2 to 10 and Reference Example 2

Figure 6:
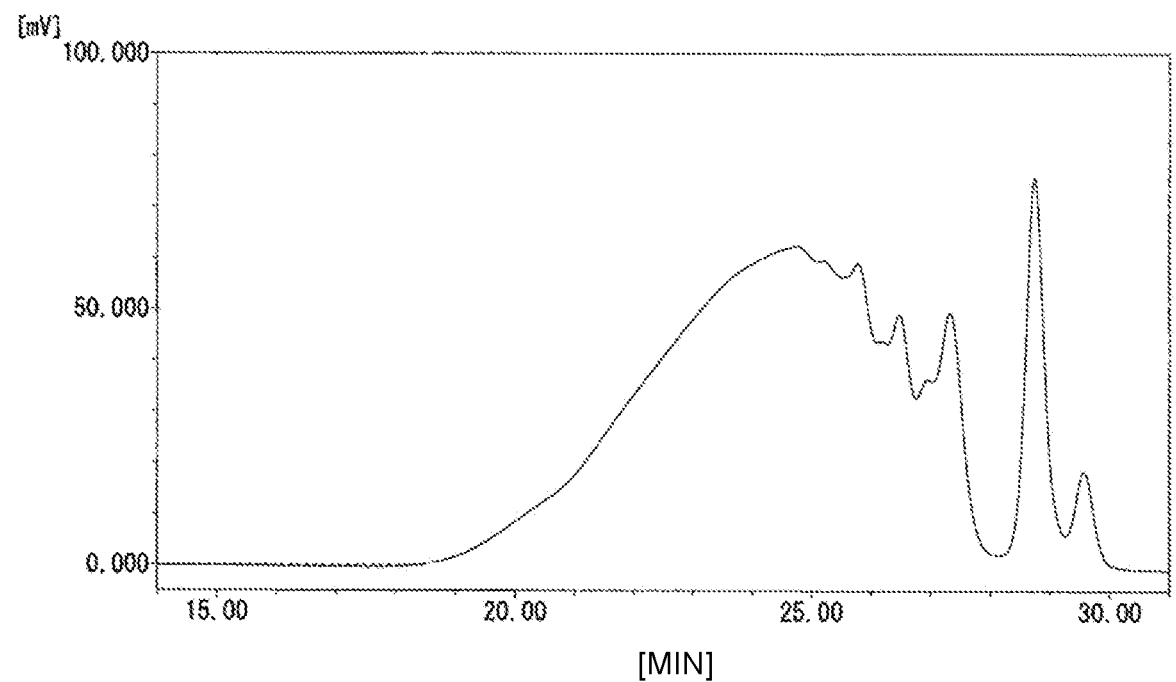
FIG. 6 A GPC chart of an active ester resin obtained in Reference Example 2.

Each active ester resin was obtained by compounding at each amount of compounding (parts) in Table 1 and by the same operations performed as in Example 1. The results are shown in Table 1. The results of GPC of active ester resin (A11) obtained in Reference Example 2 are illustrated in FIG. 6.

prepreg. Eight of the prepregs obtained and copper foil (3EC-III manufactured by Mitsui Mining & Smelting Co., Ltd., thickness 35 μm) were stacked with the copper foil being located on and below the prepregs, and the resulting stacked product was pressed in vacuum at 2 MPa in temperature conditions of 130° C.×15 minutes+210° C.×80 minutes, to thereby obtain a laminated board having a thickness of 1.6 mm. The results of the copper foil peel strength and interlayer adhesion force of the laminated board are shown in Table 2.

The prepregs obtained were ground, to thereby provide a ground prepreg powder by passing through a 100-mesh sieve. The prepreg powder obtained was placed into a fluororesin mold, and pressed in vacuum at 2 MPa in temperature conditions of 130° C.×15 minutes+210° C.×80

TABLE 1

|   | Example |  |  |  |  |  |  |  |  |  | Reference Example |
|---|---|---|---|---|---|---|---|---|---|---|---|
|   | 1 | 2 | 3 | 4 | 5 | 6 | 7 | 8 | 9 | 10 | 2 |
| P1 | 100.0 |  |  |  |  |  |  |  |  |  |  |
| P2 |  | 100.0 |  |  |  |  |  |  |  |  |  |
| P3 |  |  | 95.6 |  |  |  | 30.8 |  |  |  |  |
| P4 |  |  |  | 90.0 | 90.0 |  |  | 90.0 | 100.0 | 62.8 |  |
| P5 |  |  |  |  |  | 100.0 |  |  |  |  |  |
| P6 |  |  |  |  |  |  | 64.8 |  |  | 37.2 | 64.8 |
| P7 |  |  |  | 14.3 | 8.7 | 8.5 |  | 14.3 |  | 19.9 | 17.4 |
| B1 | 47.8 | 45.3 | 38.1 | 40.7 | 36.7 | 35.7 | 49.4 |  |  | 56.7 | 49.4 |
| B2 |  |  |  |  |  |  |  | 40.7 |  |  |  |
| B3 |  |  |  |  |  |  |  |  | 47.1 |  |  |
| TBAB | 0.01 | 0.01 | 0.01 | 0.01 | 0.01 | 0.01 | 0.01 | 0.01 | 0.01 | 0.01 | 0.01 |
| TL | 369 | 363 | 334 | 363 | 339 | 360 | 362 | 363 | 368 | 442 | 329 |
| 20% NaOH | 94.1 | 89.2 | 75.1 | 80.2 | 72.3 | 70.4 | 97.4 | 80.2 | 67.0 | 93.7 | 97.3 |
| Active ester resin | A1 | A2 | A3 | A4 | A5 | A6 | A7 | A8 | A9 | A10 | A11 |
| Amount obtained (parts) | 171 | 185 | 166 | 191 | 179 | 200 | 190 | 191 | 194 | 230 | 161 |
| Active ester equivalent (g/eq.) | 279 | 290 | 320 | 326 | 339 | 374 | 262 | 326 | 404 | 281 | 235 |
| Non-volatile content (%) | 65 | 65 | 65 | 65 | 65 | 65 | 65 | 65 | 65 | 65 | 65 |

Example 11

One hundred parts of E1 as an epoxy resin, 110 parts of A1 as a curing agent, and 0.5 parts of C1 as a curing accelerator, in terms of solid content, were compounded, and dissolved in methyl ethyl ketone, to thereby obtain an epoxy resin composition varnish. A glass cloth (WEA 7628 XS13 manufactured by Nitto Boseki Co., Ltd., 0.18 mm in thickness) was impregnated with the epoxy resin composition varnish obtained. The glass cloth impregnated was dried in a hot air oven at 150° C. for 9 minutes, to thereby obtain a minutes, to thereby obtain a test piece of 50 mm square×2 mm thickness. The results of the relative permittivity and dielectric tangent in the test piece are shown in Table 2.

Examples 12 to 20 and Comparative Examples 1 to 3

Each laminated board and each test piece were obtained by compounding at each amount of compounding (part(s)) in Table 2 and by the same operations performed as in Example 11. The results are shown in Table 2. The amounts of compounding of A1 to A11 are shown as values in terms of solid content.

TABLE 2

|   | Example |  |  |  |  |  |  |  |  |  | Comparative Example |  |  |
|---|---|---|---|---|---|---|---|---|---|---|---|---|---|
|   | 11 | 12 | 13 | 14 | 15 | 16 | 17 | 18 | 19 | 20 | 1 | 2 | 3 |
| E1 | 100 | 100 | 100 | 100 | 100 | 100 | 100 | 100 | 100 | 100 | 100 | 100 | 100 |
| A1 | 110 |  |  |  |  |  |  |  |  |  |  |  |  |
| A2 |  | 114 |  |  |  |  |  |  |  |  |  |  |  |
| A3 |  |  | 126 |  |  |  |  |  |  |  |  |  |  |
| A4 |  |  |  | 128 |  |  |  |  |  |  |  |  |  |
| A5 |  |  |  |  | 133 |  |  |  |  |  |  |  |  |
| A6 |  |  |  |  |  | 147 |  |  |  |  |  |  |  |
| A7 |  |  |  |  |  |  | 103 |  |  |  |  |  |  |
| A8 |  |  |  |  |  |  |  | 128 |  |  |  |  |  |
| A9 |  |  |  |  |  |  |  |  | 159 |  |  |  |  |
| A10 |  |  |  |  |  |  |  |  |  | 111 |  |  |  |

TABLE 2-continued

| | Example | | | | | | | | | | Comparative Example | | |
|---|---|---|---|---|---|---|---|---|---|---|---|---|---|
| | 11 | 12 | 13 | 14 | 15 | 16 | 17 | 18 | 19 | 20 | 1 | 2 | 3 |
| A11 | | | | | | | | | | | 93 | | |
| P8 | | | | | | | | | | | | 41 | |
| P6 | | | | | | | | | | | | | 77 |
| C1 | 0.50 | 0.50 | 0.50 | 0.50 | 0.50 | 0.50 | 0.50 | 0.50 | 0.50 | 0.50 | 0.50 | 0.08 | 0.15 |
| Copper foil peel strength (kN/m) | 1.3 | 1.3 | 1.2 | 1.3 | 1.4 | 1.3 | 1.5 | 1.3 | 1.4 | 1.3 | 1.3 | 1.6 | 1.6 |
| Interlayer adhesion force (kN/m) | 1.5 | 1.6 | 1.0 | 1.6 | 1.6 | 1.3 | 1.4 | 1.6 | 1.3 | 1.3 | 0.9 | 1.2 | 1.2 |
| Relative permittivity | 2.85 | 2.84 | 2.82 | 2.88 | 2.88 | 2.83 | 2.83 | 2.90 | 2.87 | 2.84 | 2.98 | 3.17 | 3.07 |
| Dielectric tangent | 0.010 | 0.009 | 0.008 | 0.009 | 0.008 | 0.007 | 0.007 | 0.010 | 0.010 | 0.010 | 0.012 | 0.021 | 0.020 |
| Glass transition temperature (° C.) | 167 | 151 | 114 | 150 | 146 | 143 | 150 | 153 | 148 | 161 | 169 | 184 | 172 |

As is clear from the results, each of the active ester resins obtained in Examples and a resin composition including such each active ester resin can provide a resin cured product that exhibits very favorable low-dielectric properties and furthermore that is also excellent in adhesion force.

INDUSTRIAL APPLICABILITY

The epoxy resin composition of the present invention allows a cured product thereof to exhibit excellent dielectric properties, and can be suitably used in a printed-wiring board application, in particular, for example, a mobile application and a server application, in which a low dielectric tangent is strongly required.

The invention claimed is:

1. An active ester resin having a polyaryloxy unit containing a dicyclopentenyl group and represented by the following formula (1), and a polyarylcarbonyl unit:

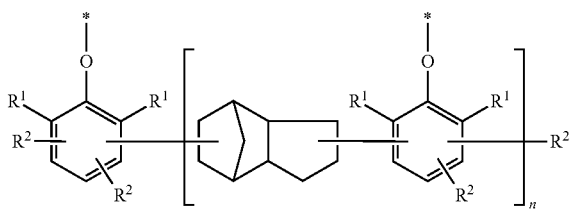

(1)

wherein each $R^1$ independently represents a hydrocarbon group having 1 to 8 carbon atoms, each $R^2$ independently represents a hydrogen atom, or a dicyclopentenyl group represented by the following formula (1a) or formula (1b), and at least one $R^2$ is the dicyclopentenyl group; represents the number of repetitions and an average value thereof is a number of 1 to 5; and "*" is a linking site bonded to a carbonyl group of the polyarylcarbonyl unit,

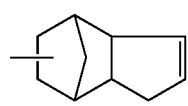

(1a)

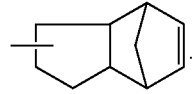

(1b)

2. The active ester resin according to claim 1, comprising an additional polyaryloxy unit other than the unit represented by the formula (1) as a polyaryloxy unit, and the additional polyaryloxy unit is a unit represented by the following formula 2 and/or formula (3):

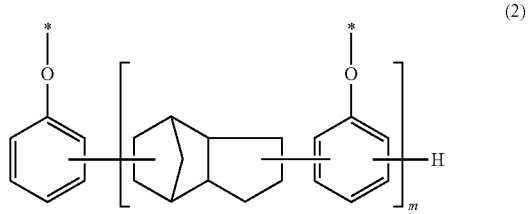

(2)

wherein m represents the number of repetitions and an average value thereof is a number of 1 to 5; and "*" is a linking site bonded to the carbonyl group of the polyarylcarbonyl unit;

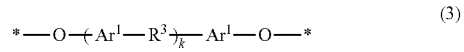

(3)

wherein each $Ar^1$ independently represents any aromatic ring group of a benzene ring or a naphthalene ring, and an aromatic ring thereof optionally has an alkyl group having 1 to 10 carbon atoms, an alkoxy group having 1 to 10 carbon atoms, an aryl group having 6 to 11 carbon atoms, an aralkyl group having 7 to 12 carbon atoms, an aryloxy group having 6 to 11 carbon atoms, or an aralkyloxy group having 7 to 12 carbon atoms, as a substituent; $R^3$ is a direct bond, or a divalent group selected from the group consisting of a hydrocarbon group having 1 to 20 carbon atoms, —CO—, —O—, —S—, —SO$_2$— and —C(CF$_3$)$_2$—; k is 0 or 1; and "*" is a linking site bonded to the carbonyl group of the polyarylcarbonyl unit.

3. The active ester resin according to claim 1, having a monoaryloxy group at a molecular chain end, and the monoaryloxy group is a group represented by the following formula (4) and/or formula (5):

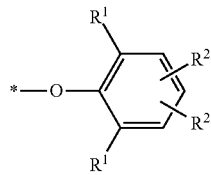
(4)

wherein each $R^1$ independently represents a hydrocarbon group having 1 to 8 carbon atoms, each $R^2$ independently represents a hydrogen atom, or a dicyclopentenyl group represented by the following formula (1a) or formula (1b) and at least one $R^2$ is the dicyclopentenyl group; n represents the number of repetitions and an average value thereof is a number of 1 to 5; and "*" is a linking site bonded to the carbonyl group of the polyarylcarbonyl unit;

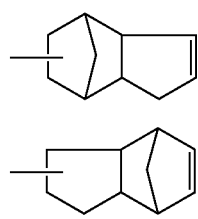
(1a)

(1b)

$$*-O-(Ar^2-R^4)_k-Ar^2$$ (5)

wherein each $Ar^2$ independently represents any aromatic ring group of a benzene ring or a naphthalene ring, and an aromatic ring thereof optionally has an alkyl group having 1 to 10 carbon atoms, an alkoxy group having 1 to 10 carbon atoms, an aryl group having 6 to 11 carbon atoms, an aralkyl group having 7 to 12 carbon atoms, an aryloxy group having 6 to 11 carbon atoms, or an aralkyloxy group having 7 to 12 carbon atoms, as a substituent; $R^4$ is a direct bond, or a divalent group selected from the group consisting of $-CH_2-$, $-C(CH_3)_2-$, $-CH(CH_3)-$, $-CO-$, $-O-$, $-S-$, $-SO_2-$ and $-C(CF_3)_2-$; k is 0 or 1; and "*" is a linking site bonded to the carbonyl group of the polyarylcarbonyl unit.

4. The active ester resin according to claim 1, wherein the polyarylcarbonyl unit is a unit represented by the following formula (6):

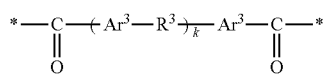
(6)

wherein each $Ar^3$ independently represents any aromatic ring group of a benzene ring or a naphthalene ring, and an aromatic ring thereof optionally has an alkyl group having 1 to 10 carbon atoms, an alkoxy group having 1 to 10 carbon atoms, an aryl group having 6 to 11 carbon atoms, an aralkyl group having 7 to 12 carbon atoms, an aryloxy group having 6 to 11 carbon atoms, or an aralkyloxy group having 7 to 12 carbon atoms, as a substituent; $R^3$ is a direct bond, or a divalent group selected from a hydrocarbon group having 1 to 20 carbon atoms, $-CO-$, $-O-$, $-S-$, $-SO_2-$ and $-C(CF_3)_2-$; k is 0 or 1; and "*" is a linking site bonded to the linking site of the polyaryloxy unit.

5. A method for producing an active ester resin, comprising: reacting a 2,6-disubstituted phenol compound and dicyclopentadiene to obtain an aromatic hydroxy compound containing a dicyclopentenyl group and represented by the following formula (7); and reacting the aromatic hydroxy compound and an aromatic polyvalent carboxylic acid or an acid halide thereof:

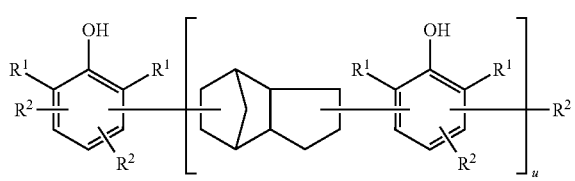
(7)

wherein each $R^1$ independently represents a hydrocarbon group having 1 to 8 carbon atoms, each $R^2$ independently represents a hydrogen atom, or a dicyclopentenyl group represented by the following formula (1a) or formula (1b) and at least one $R^2$ is the dicyclopentenyl group; and u represents the number of repetitions and contains a u=0 component and a u≥1 component, and an average value of the u≥1 component is a number of 1 to 5,

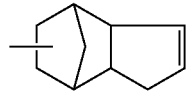
(1a)

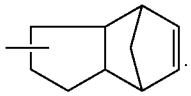
(1b)

6. The method for producing the active ester resin according to claim 5, wherein the aromatic hydroxy compound is obtained by reacting 0.28 mol to 2 mol of dicyclopentadiene per mol of a 2,6-disubstituted phenol compound.

7. An epoxy resin composition essentially comprising the active ester resin according to claim 1, and an epoxy resin.

8. A cured product obtained by curing the epoxy resin composition according to claim 7.

9. A prepreg using the epoxy resin composition according to claim 7.

10. A laminated board using the epoxy resin composition according to claim 7.

11. A material for a circuit substrate, using the epoxy resin composition according to claim 7.

* * * * *